United States Patent
Okada et al.

(10) Patent No.: US 8,355,023 B2
(45) Date of Patent: Jan. 15, 2013

(54) DRAWING GENERATION DEVICE, METHOD AND PROGRAM FOR ELECTRIC CABLE HOUSING COMPONENTS

(75) Inventors: Yuuki Okada, Kawasaki (JP); Shingo Fujii, Kawasaki (JP); Hiroki Yabu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 856 days.

(21) Appl. No.: 12/482,098

(22) Filed: Jun. 10, 2009

(65) Prior Publication Data

US 2009/0309875 A1 Dec. 17, 2009

(30) Foreign Application Priority Data

Jun. 13, 2008 (JP) ................................ 2008-155979

(51) Int. Cl.
*G06T 15/20* (2011.01)
(52) U.S. Cl. ......... 345/427; 345/418; 345/419; 345/420
(58) Field of Classification Search .......... 345/418–420, 345/427; 382/312
See application file for complete search history.

(56) References Cited

U.S. PATENT DOCUMENTS

| | | | | |
|---|---|---|---|---|
| 6,027,682 A * | 2/2000 | Almquist et al. | ............ | 264/401 |
| 6,326,964 B1 * | 12/2001 | Snyder et al. | ................ | 345/419 |
| 6,411,290 B1 * | 6/2002 | Sasaki | ........................... | 345/418 |
| 6,512,518 B2 * | 1/2003 | Dimsdale | ..................... | 345/427 |
| 6,573,903 B2 * | 6/2003 | Gantt | ............................ | 345/619 |
| 7,102,636 B2 * | 9/2006 | Reshetov et al. | ............. | 345/420 |
| 7,215,430 B2 * | 5/2007 | Kacyra et al. | ................. | 356/601 |
| 2003/0071810 A1 * | 4/2003 | Shoov et al. | .................. | 345/420 |
| 2007/0255544 A1 | 11/2007 | Yvon et al. | | |
| 2007/0285424 A1 | 12/2007 | Cheng et al. | | |

FOREIGN PATENT DOCUMENTS

| | | |
|---|---|---|
| JP | 10-269269 A | 10/1998 |
| JP | 2000-123052 A | 4/2000 |
| JP | 2006-195544 A | 7/2006 |
| JP | 2006-330887 A | 12/2006 |
| JP | 2007-257136 A | 10/2007 |
| KR | 10 0786285 B1 | 12/2007 |

* cited by examiner

*Primary Examiner* — Kimbinh T Nguyen
(74) *Attorney, Agent, or Firm* — Foley & Lardner LLP

(57) ABSTRACT

To make possible using three-dimensional data of electric cable housing components to automatically generate and output a drawing that is simple and useful as two-dimensional data for clearly representing the relationship between upper and lower components. Determination controller 121 of two-dimensional data generation unit 120 converts three-dimensional data of electric cable housing components, which is read by the data reading part 122, into a line segment for each component by diagram generation part 123, and converts a contact part between components or a part where components partially overlap with each other, into an intersection point, to generate a diagram composed of the line segment and intersection point. Determination controller 121, by coplanarization part 125, shifts line segments of a plurality of components that overlap vertically on the diagram onto a single plane, and slides the line segments at a predetermined interval to represent the vertical overlap on the plane. Determination controller 121 outputs the generated two-dimensional data of the electric cable housing components from interface unit 110 in the form of file by file output part 127, and stores the data in the form of file in storage unit 130.

16 Claims, 14 Drawing Sheets

FIG. 8
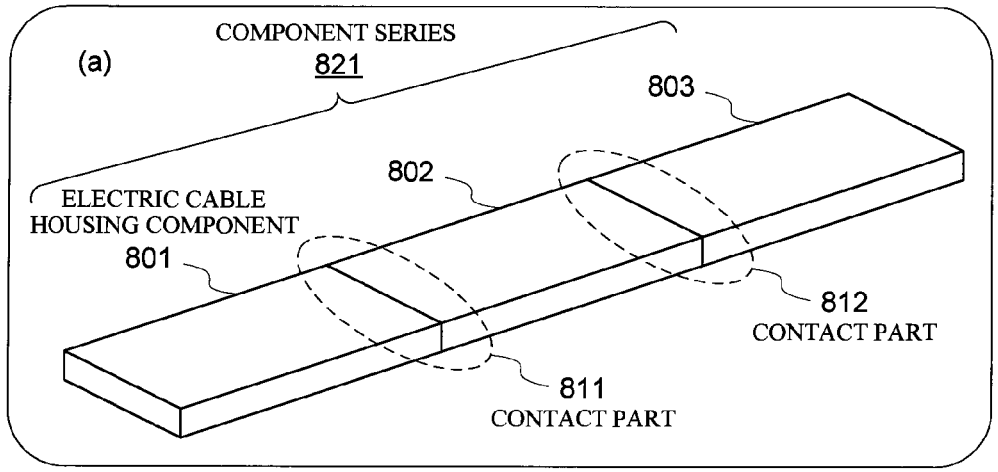
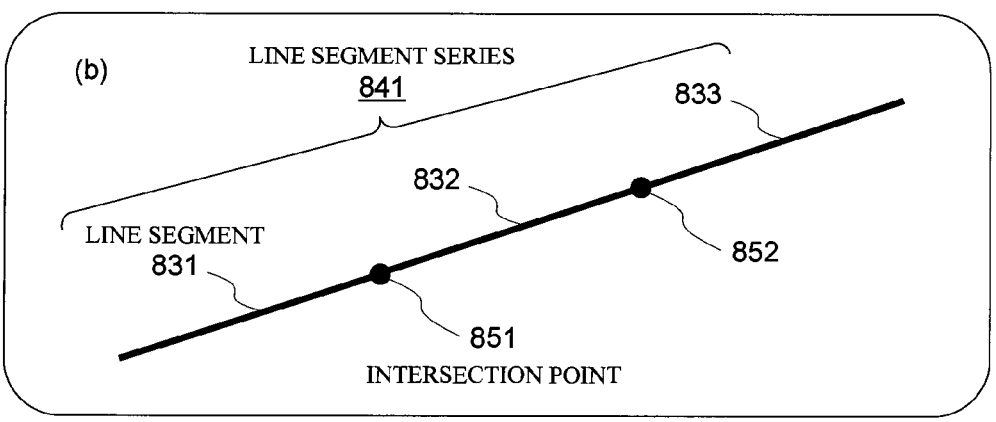
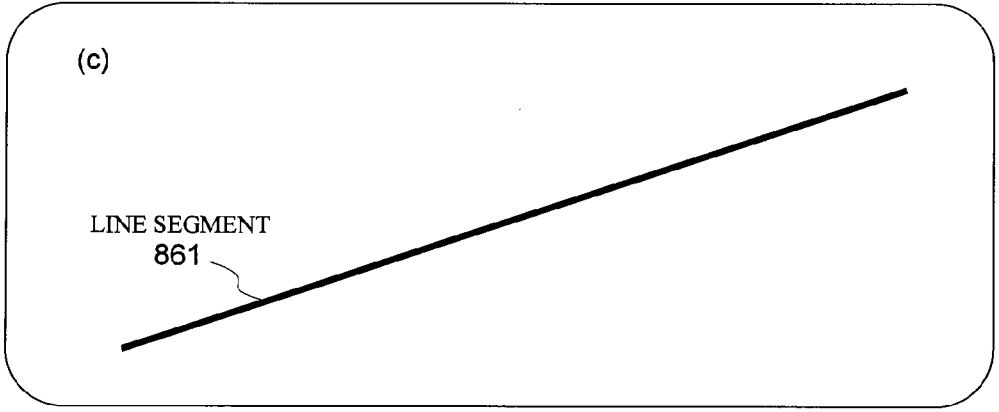

FIG. 13

| Part Name | Part No. | Long Description | Part Category | Piece No. | Geometry | RefLine-X | Coords-X | RefLine-Y | Coords-Y | RefLine-Z |
|---|---|---|---|---|---|---|---|---|---|---|
| CABLETRAY_201 | | | CABLETRAY | 0 | OPT | | 0 | | 0 | |
| CABLETRAY_201 | | | CABLETRAY | 1 | BOX | NA | 0 | NA | 0 | NA |
| CABLETRAY_201 | | | CABLETRAY | 2 | BOX | NA | 3000 | NA | 0 | NA |
| CABLETRAY_201 | | | CABLETRAY | 3 | BOX | NA | 6000 | NA | 0 | NA |
| CABLETRAY_201 | | | CABLETRAY | 4 | BOX | NA | 1500 | NA | -250 | NA |
| CABLETRAY_201 | | | CABLETRAY | 5 | BOX | NA | 4500 | NA | 0 | NA |
| CABLETRAY_201 | | | CABLETRAY | 6 | BOX | NA | 7500 | NA | -100 | NA |

| Coords-Z | Length or BendRadius | Width or Diameter | Height or BendAngle | Yaw-Angle | Pitch-Angle | Roll-Angle | Sub Part Name | TP No. | Color |
|---|---|---|---|---|---|---|---|---|---|
| 0 | NA | NA | NA | 0 | 0 | 0 | | | |
| 0 | 3000 | 500 | 150 | 0 | 0 | 0 | | | YELLOW |
| 0 | 3000 | 500 | 150 | 0 | 0 | 0 | | | YELLOW |
| 0 | 3000 | 500 | 150 | 0 | 0 | 0 | | | YELLOW |
| 0 | 3000 | 500 | 150 | -90 | 0 | 0 | | | YELLOW |
| 0 | 3000 | 500 | 150 | -90 | 0 | 0 | | | YELLOW |
| 0 | 3000 | 500 | 150 | -45 | 0 | 0 | | | YELLOW |

| Display Type | Center Line | Trajectory | Subtraction | Cut ID | Standard Item | Drawing No. | Drawing Rev. | Connected To | Route No. |
|---|---|---|---|---|---|---|---|---|---|
| | | MC | | | | | | | SAMPLE201 |
| | | MC | | | | | | | SAMPLE201 |
| | | MC | | | | | | | SAMPLE201 |
| | | MC | | | | | | | SAMPLE201 |
| | | MC | | | | | | | SAMPLE201 |
| | | MC | | | | | | | SAMPLE201 |

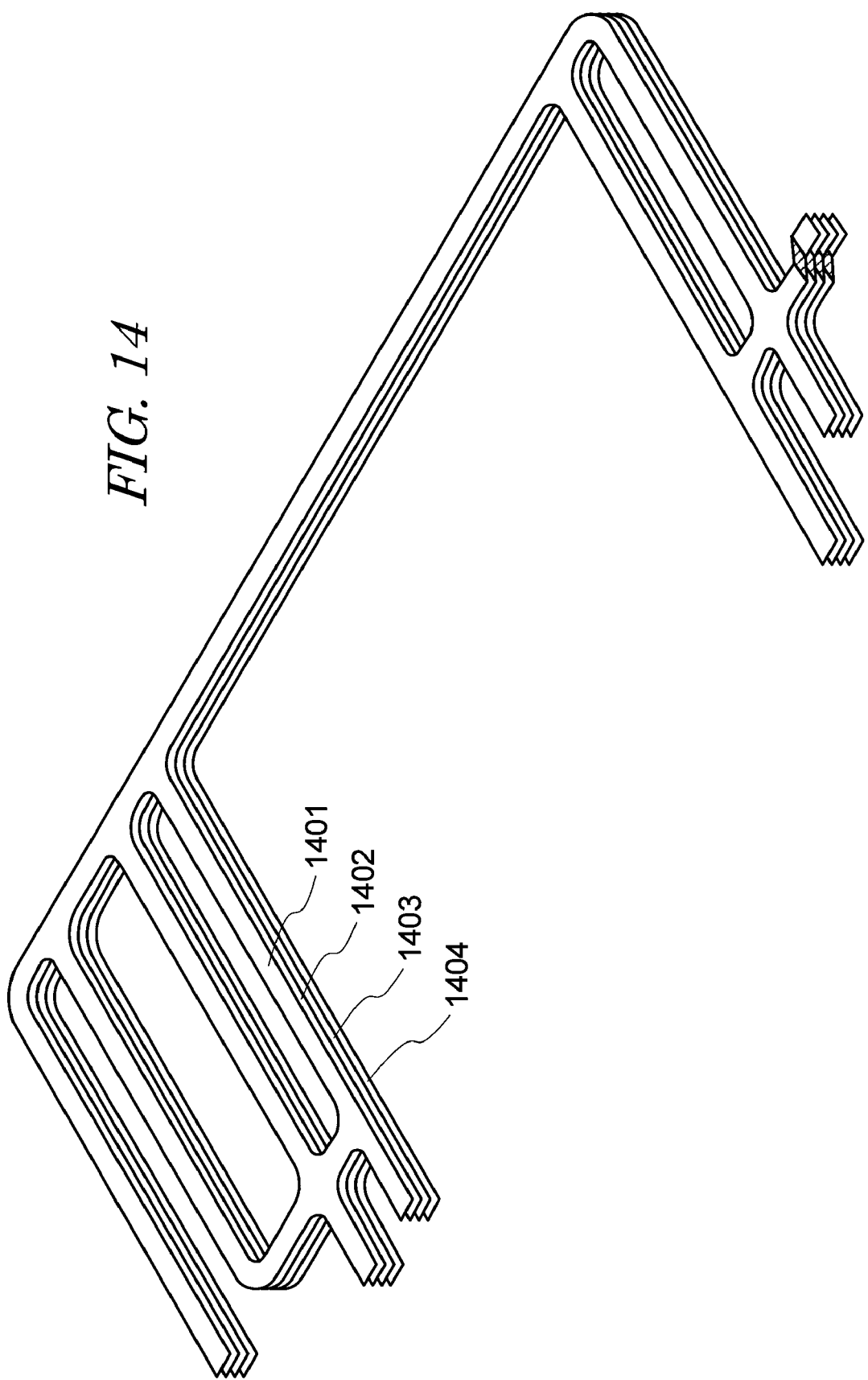

DRAWING GENERATION DEVICE, METHOD AND PROGRAM FOR ELECTRIC CABLE HOUSING COMPONENTS

BACKGROUND OF THE INVENTION

1. Field of the Invention

The present invention relates to a drawing generation device, method and program for electric cable housing components for converting three-dimensional data of electric cable housing components generated by a three-dimensional arrangement adjustment CAD into two-dimensional data by using a computer, and outputting the converted data in the form of drawing.

2. Description of the Related Art

Drawings of electric cable housing components of a thermal/nuclear/hydraulic plant are generated after arrangement planning is performed at the time of plant layout. Recently, this arrangement planning is recently performed by a three-dimensional arrangement adjustment CAD, for the reason of convenience of data input, expansion of the data to the downstream after the data input, and management of the data.

When performing the arrangement planning on electric cable housing components, a designer arranges the electric cable housing components on a three-dimensional space to generate a route of the electric cable housing components by using a three-dimensional arrangement adjustment CAD, thereby generating arrangement data of the electric cable housing components.

On the other hand, because two-dimensional drawing data is required as a drawing to be submitted to a client or a drawing for a construction site material, the three-dimensional data needs to be converted.

However, the electric cable housing components are characterized in being arranged and installed in multi-stages in a vertically stacked manner. Therefore, it was difficult to for a drawing of the electric cable housing components to function as an automatic drawing output.

It was also difficult to represent an intersection point of the mainstream and a branch of the electric cable housing components and an intersection point of the components disposed continuously in series.

In addition, even when attaching route information of the electric cable housing components and information on the vertical direction height or the like to a drawing, it was difficult to determine what section to pull out a lead line from to represent these intersection points on a redundantly represented plan view.

On the other hand, as a conventional method for converting three-dimensional data into two-dimensional data, there is, for example, a method for looking down three-dimensional data in a top direction and outputting the three-dimensional data as a plan view. However, when this method is applied to three-dimensional data of the electric cable housing components, because the electric cable housing components are disposed in multi-stages in a vertically stacked manner, upper and lower electric cable housing components overlap with each other and, as a result, the lower electric cable housing component is hidden on the plan view.

As a method different from the method of using a plan view, in recent tools, there is a tool for automatically outputting an isometric drawing from piping data of a three-dimensional arrangement adjustment CAD. Although the isometric drawing of this case possesses only simple and minimum information required for installation, the isometric drawing is generated with a value guaranteeing that at least there is not problem in the installation as long as the information is output.

Another thing considered is to represent the electric cable housing components using an isometric drawing as a long component such as a pipe. However, even with the isometric drawing, it is difficult to draw a drawing that clearly represents the relationship between the upper and lower electric cable housing components disposed in multi-stages in a vertically stacked manner.

Therefore, in the conventional technology, because it was difficult to use the three-dimensional data of the electric cable housing components to automatically output a drawing useful as the two-dimensional data while having the three-dimensional data, the drawing of the two-dimensional data had to be generated manually. However, since generating a drawing of the two-dimensional data manually is laborious and thus a heavy burden on the designer, it was necessary to improve the designer's work by utilizing the three-dimensional data.

As a conventional technology related to the arrangement planning for electric cable housing components, Japanese Patent Application Publication No. 2007-257136, for example, describes a technology for calculating a cable route by using a cable layout plan as input data. Also, Japanese Patent Application Publication No. 2006-195544 describes a technology for selecting cable sizes and cable routes in consideration of a voltage drop. Japanese Patent Application Publication No. 2006-330887, as a conventional technology related to an arrangement planning for plant equipment, describes a technology for generating an equipment layout design drawing by means of a three-dimensional CAD.

However, the technologies described in Japanese Patent Application Publication No. 2007-257136, Japanese Patent Application Publication No. 2006-195544 and Japanese Patent Application Publication No. 2006-330887 are not designed to use three-dimensional data to automatically output a drawing useful as the two-dimensional data.

As described above, in the conventional technologies, a drawing of two-dimensional data had to be generated manually while having the three-dimensional data, and such a manual work is laborious and thus a heavy burden on the designer. For this reason, it was necessary to improve the designer's work by utilizing the three-dimensional data.

SUMMARY OF THE INVENTION

The present invention was devised in order to solve the above-described problems of the conventional technologies, and an object of the present invention is to provide a drawing generation device, method and program for electric cable housing components, which are capable of using three-dimensional data of electric cable housing components to automatically generate and output a drawing that is simple and useful as two-dimensional data for clearly representing the relationship between upper and lower components.

In order to achieve the above object, the present invention is a drawing generation device for electric cable housing components, which converts three-dimensional data of electric cable housing components generated by a three-dimensional arrangement adjustment CAD into two-dimensional data by using a computer, and outputs the converted data in the form of drawing, the computer having: interface means for performing input/outputs various instructions and data; two-dimensional data generation means for processing the three-dimensional data of electric cable housing components to generate a drawing of the two-dimensional data; and storage means for storing three-dimensional data of electric cable housing components that is acquired by the interface means or another means, as well as two-dimensional data of electric cable housing components that is obtained as a result of process performed by the two-dimensional data generation means, wherein the two-dimensional data generation means has the following technical characteristics.

Specifically, the two-dimensional data generation means has data reading means, diagram generation means, coplanarization means, and file output means. The data reading means is for reading the three-dimensional data of the electric cable housing components that is stored in the storage means. The diagram generation means is for converting the three-dimensional data of the electric cable housing components, which is read by the data reading means, into a line segment for each component, and converting a contact part between the components or a part where the components partially overlap with each other, into an intersection point, to convert the three-dimensional data of the electric cable housing components and generate a diagram composed of the line segment and intersection point. The coplanarization means for shifting the line segments of a plurality of components that overlap vertically on the diagram generated by the diagram generation means, onto a single plane, and sliding the line segments at a predetermined interval that represents the vertical overlap on the plane to perform drawing. The file output means for outputting, from the interface means, the two-dimensional data of electric cable housing components that is obtained by the diagram generation means and the coplanarization means, in the form of file, and storing the output two-dimensional data in the form of file in the storage means.

The drawing generation method for electric cable housing components and the drawing generation program for electric cable housing components according to the present invention grasp the characteristics of the above-described device from perspectives of both a method and a computer program.

According to the present invention described above, a simple diagram composed of the line segment and intersection point can be generated automatically from the three-dimensional data of the electric cable housing components, while holding the information on the contact and partial overlap between the components in the three-dimensional data. Then, by sliding the vertically overlapped components on a single plane to generate a drawing, a drawing that is useful as the two-dimensional data can be easily generated to clearly represent the relationship between the vertically overlapped components. In addition, the generated drawing of the electric cable housing components can be automatically output in its state that is useful as the two-dimensional data, and can be also output on a screen or printed out. The drawing can be also stored in the storage means so that it can be output any time if necessary.

The present invention can provide a drawing generation device, method and program for electric cable housing components, which are capable of using three-dimensional data of electric cable housing components to automatically generate and output a drawing that is simple and useful as two-dimensional data for clearly representing the relationship between upper and lower components.

BRIEF DESCRIPTION OF THE DRAWINGS

FIG. 8 is a diagram showing a specific example of the line segment integration process shown in FIG. 4;

FIG. 13 is a diagram showing a data example obtained when the three-dimensional data shown in FIG. 11 is output in the form of spreadsheet;

FIG. 14 is a perspective view in which an example of the three-dimensional data of the electric cable housing components generated by a three-dimensional arrangement adjustment CAD unit shown in FIG. 1 is viewed from obliquely above.

DESCRIPTION OF THE PREFERRED EMBODIMENTS

Hereinafter, an embodiment to which a drawing generation device for electric cable housing components according to the present invention is applied is described specifically with reference to the drawings.

[Configuration]

Figure 1:
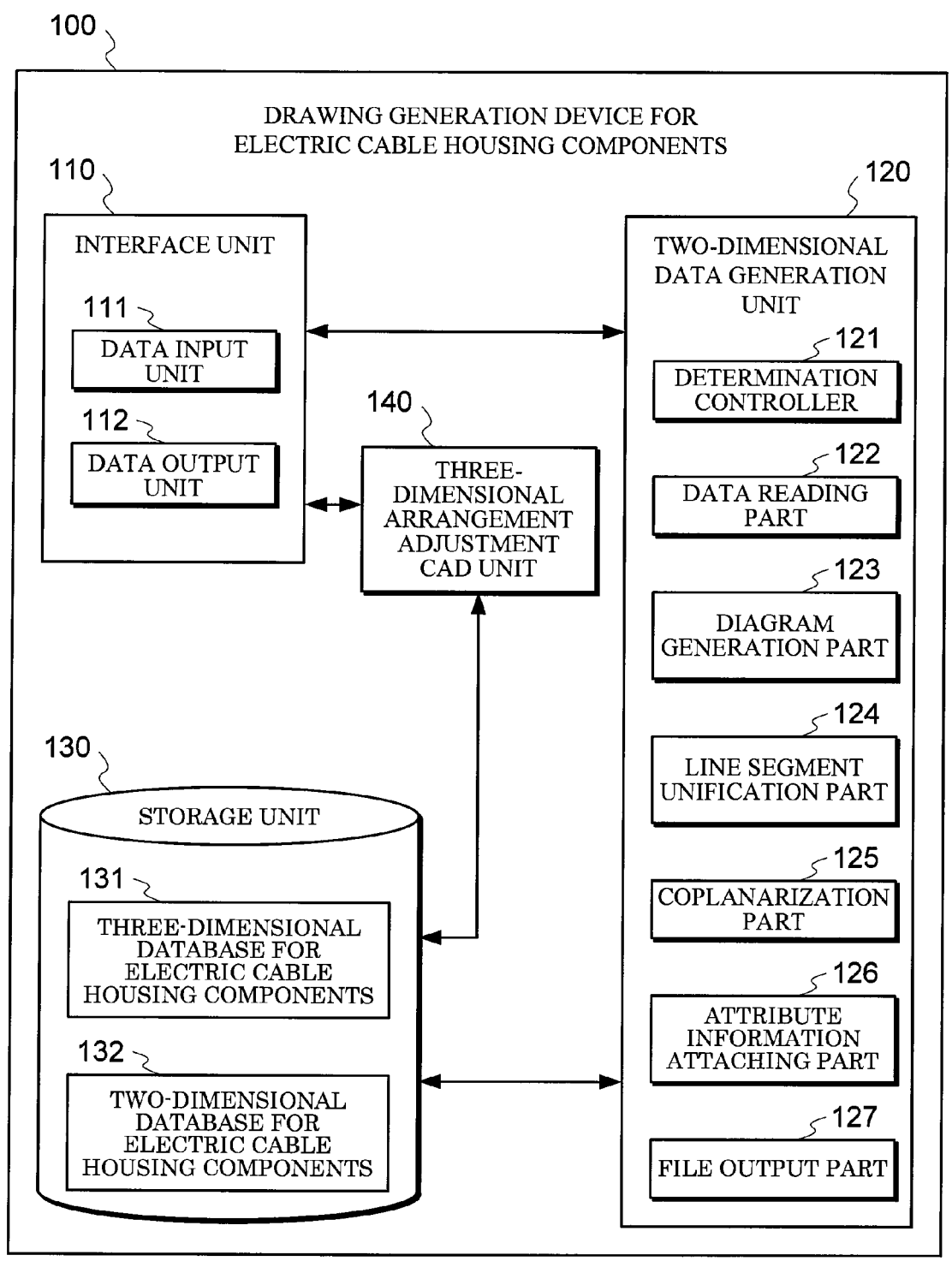
FIG. 1 is a block diagram showing a configuration of a drawing generation device for electric cable housing components according to an embodiment of the present invention.

FIG. 1 is a block diagram showing a configuration of a drawing generation device 100 for electric cable housing components according to an embodiment of the present invention.

As shown in FIG. 1, the drawing generation device 100 for electric cable housing components according to this embodiment has an interface unit 110 for inputting/outputting various instructions and data, a two-dimensional data generation unit 120 for processing three-dimensional data of electric cable housing components and converting the three-dimensional data to two-dimensional data, a storage unit 130 for storing the three-dimensional data of the electric cable housing components that is input by the interface unit 110 and the two-dimensional data of the electric cable housing components that is obtained as the result of the process performed by the two-dimensional data generation unit 120, and a three-dimensional arrangement adjustment CAD unit 140 for generating the three-dimensional data of the electric cable housing components. The drawing generation device 100 for electric cable housing components is realized by incorporating a program in a versatile personal computer, the program being specialized in realizing the characteristic functions of the present invention (a drawing generation program for electric cable housing components). The detail of each part is as follows.

The interface unit 110 has a data input unit 111 and a data output unit 112. The data input unit 111 is an input device, such as a mouse or a keyboard, for inputting various instructions and data into the computer in response to an operation of a user. The data output unit 112 is an output device, such as a display or a printer, for displaying or outputting to the user the data input by the data input unit 111, the data stored in the storage unit 130, and the results processed by the two-dimensional data generation unit 120 and the three-dimensional arrangement adjustment CAD unit 140. Specifically, the interface unit 110 performs an exchange with the computer and the user and is generally called "user interface."

The two-dimensional data generation unit 120 has a determination controller 121, a data reading part 122, a diagram generation part 123, a line segment unification part 124, a coplanarization part 125, an attribute information attaching part 126, and a file output part 127. Each of the parts 121 to 127 configuring the two-dimensional data generation unit 120 is realized by a combination of the main components of the computer, which are a microprocessor and memory, and a program module specialized in realizing the function of each part.

The determination controller 121 is means for serving as the principle for a two-dimensional data generation process performed by the two-dimensional data generation unit 120 to control the rest of the parts and advance the generation process while determining the state of the process. The data reading part 122 is means for reading the three-dimensional data of the electric cable housing components that is stored in the storage unit 130. The diagram generation part 123 is means for converting the read three-dimensional data of the electric cable housing components into a line segment for each component, and converting a contact part between the components or a part where the components partially overlap with each other, into an intersection point, to convert the three-dimensional data of the electric cable housing components and generate a diagram composed of the line segment and intersection point. The line segment unification part 124 is means for unifying the line segments of the plurality of electric cable housing components in the diagram generated by the diagram generation part 123, when the read three-dimensional data items of the plurality of components are continuously arranged in series.

The coplanarization part 125 is means for shifting the line segments of the plurality of components that are overlapped vertically in the generated diagram, onto the same plane, and sliding the line segments at a predetermined interval to represent the vertical overlap on the plane. The attribute information attaching part 126 is means for attaching the descriptions of attribute information indicators representing attribute information of the read three-dimensional data of the electric cable housing components to the vicinity of the line segments of the components. The file output part 127 is for outputting, from the data output unit 112 of the interface unit 110, the two-dimensional data of the electric cable housing components that is obtained by the diagram generation part 123, line segment unification part 124, coplanarization part 125, and attribute information attaching part 126 in the form of file, and storing the output two-dimensional data in the form of file in the storage unit 130.

The storage unit 130 is realized by one or more storage devices selected from a hard disk fixed to the computer, a removable CD, DVD or MO, and other auxiliary storage devices. The storage region of this storage unit 130 is constructed by a three-dimensional database 131 for the electric cable housing components and a two-dimensional database 132 for the electric cable housing components.

The three-dimensional database 131 for the electric cable housing components stores the three-dimensional data of the electric cable housing components, which are either input by the interface unit 110 or generated by the three-dimensional arrangement adjustment CAD unit 140. The two-dimensional database 132 for the electric cable housing components stores the two-dimensional data of the electric cable housing components, which are obtained as the result of the process performed by the two-dimensional data generation unit 120.

The three-dimensional arrangement adjustment CAD unit 140 is means for generating the three-dimensional data of the electric cable housing components while displaying the three-dimensional data of the electric cable housing components on the display of the data output unit 112, in response to the data input from the user using the data input unit 111 of the interface unit 110, and then storing the completed three-dimensional data in the storage unit 130. This three-dimensional arrangement adjustment CAD unit 140 also uses the data output unit 112 to output the three-dimensional data of the electric cable housing components stored in the storage unit 130, in response to a data output instruction from the user using the data input unit 111.

Such three-dimensional arrangement adjustment CAD unit 140 is realized by a combination of the main components of the computer, which are a microprocessor and memory, and a program module specialized in realizing the function of the three-dimensional arrangement adjustment CAD.

[Operations]

The operations of the drawing generation device 100 for electric cable housing components according to the present embodiment are described next, the drawing generation device 100 having the following configurations.

[Overview of Process Flow]

Figure 2:
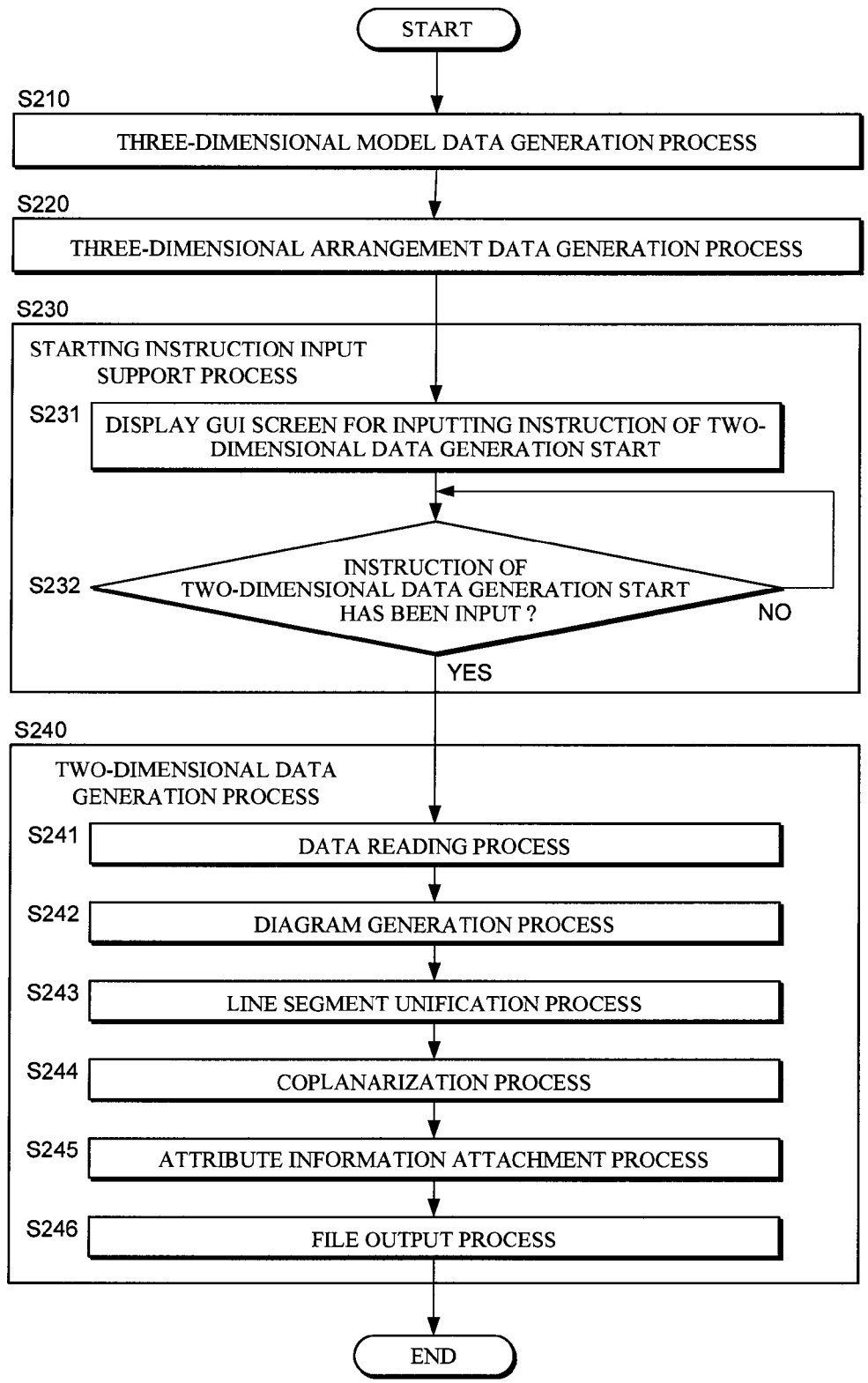
FIG. 2 is a flowchart showing an overview of a flow of a process performed by the drawing generation device for electric cable housing components that is shown in FIG. 1.

FIG. 2 is a flowchart showing an overview of a flow of a process performed by the drawing generation device 100 for electric cable housing components according to the present embodiment. As shown in FIG. 2, the three-dimensional arrangement adjustment CAD unit 140 generates three-dimensional model data of electric cable housing components in response to a data input from the user, and stores the generated three-dimensional model data in the storage unit 130 (a three-dimensional model data generation process S210).

In this three-dimensional model data generation process (S210), the three-dimensional arrangement adjustment CAD unit 140 first generates the three-dimensional model data of the electric cable housing components while displaying the three-dimensional model data on the display of the data output unit 112, in response to the data input from the user using the data input unit 111. The three-dimensional arrangement adjustment CAD unit 140 then stores the generated three-dimensional model data in the three-dimensional database 131 for the electric cable housing components that is provided in the storage unit 130.

The three-dimensional arrangement adjustment CAD unit 140 generates arrangement data of a three-dimensional model of the electric cable housing components in response to the three-dimensional model data of the electric cable housing components that is generated in the three-dimensional model data generation process (S210) and the data input from the user that corresponds to the three-dimensional model data, and then stores the generated arrangement data of the three-dimensional model in the storage unit 130 (a three-dimensional arrangement data generation process S220).

In this three-dimensional arrangement data generation process (S220), the three-dimensional arrangement adjustment CAD unit 140 first displays, on the display of the data output unit 112, the three-dimensional model data generated in the three-dimensional model data generation process (S210) and stored in the three-dimensional database 131 for the electric cable housing components that is provided in the storage unit 130. The three-dimensional arrangement adjustment CAD unit 140 then generates, on the display, the arrangement data of the three-dimensional model of the electric cable housing components in response to the data input from the user using the data input unit 111. The three-dimensional arrangement adjustment CAD unit 140 thereafter stores the generated arrangement data of the three-dimensional model in the three-dimensional database 131 for the electric cable housing components that is provided in the storage unit 130.

Here, a specific data format of the arrangement data of the three-dimensional model of the electric cable housing components may be a spreadsheet format, text format, database format, or any other format that is directly read by at least various other application programs. Note in the present embodiment that attribute information of each electric cable housing components, such as route numbers of the electric cable housing components, route types, or heights of the components in a vertical direction, are completely input as a part of the data during the three-dimensional model generation process (S210) or the three-dimensional arrangement data generation process (S220).

In addition, because a specific method for generating the three-dimensional model data of the electric cable housing components or the arrangement data of the three-dimensional model of the electric cable housing components is not a feature of the present invention, and can employ various existing technologies appropriately, the explanation thereof is omitted.

The two-dimensional data generation unit 120 starts a series of two-dimensional data generation processes (S240) at a point in time when a GUI screen is displayed and the user inputs an instruction of a two-dimensional data generation start (starting instruction input support process S230).

In the starting instruction input support process (S230), the determination controller 121 of the two-dimensional data generation unit 120 first uses the data reading part 122 to display, on the display of the data output unit 112, the GUI screen for allowing the user to input the instruction of the two-dimensional data generation start for the three-dimensional data of the electric cable housing components (S231). When the user inputs the instruction of the two-dimensional data generation start on the GUI screen by using the data input unit 111 (YES in S232), the two-dimensional data generation unit 120 starts the series of two-dimensional data generation processes (S240) in response to the input.

In the two-dimensional data generation processes (S240), the determination controller 121 of the two-dimensional data generation unit 120 first uses the data reading part 122 to read the three-dimensional data of the electric cable housing components (the three-dimensional model data and the arrangement data thereof) that is stored in the three-dimensional database 131 of the electric cable housing components that is provided in the storage unit 130, on a work area of the memory (a data reading process S241).

The determination controller 121 then converts the read three-dimensional data of the electric cable housing components by using the diagram generation part 123 to generate a diagram composed of "the segment for each component" and "the intersection point which is a contact part between the components or a part where the components partially overlap with each other" (a diagram generation process S242), and uses the line segment unification part 124 to integrate "the line segments of the plurality of components on the same vector that are continuously arranged in series," out of the line segments in the generated diagram (a line segment integration process S243).

The determination controller 121 then moves "the line segments of the plurality of components that are overlapped vertically" in the diagram obtained as a result of the diagram generation process and the line segment integration process, on the same plane by means of the coplanarization part 125, and generate a drawing by sliding the line segments at a predetermined interval to represent the vertical overlap (a coplanarization process S244). As a result, a diagram of the two-dimensional data of the electric cable housing components is completed (a diagram showing images of the components).

Next, the determination controller 121 uses the attribute information attaching part 126 to attach the descriptions of attribute information indicators representing the attribute information of the three-dimensional data of the electric cable housing components, to the vicinity of the line segments of the corresponding components in the drawing resulted from the diagram generation process, line segment integration process, and coplanarization process (an attribute information application process S245). Here, the attribute information of the electric cable housing components that are described as the attribute information indicators include the route numbers of the electric cable housing components, route types, heights of the components in the vertical direction, and the like as described above.

As described above, by attaching the descriptions of the attribute information indicators representing the attribute information of the three-dimensional data of the electric cable housing components to the vicinity of the line segments of the components by means of the attribute information attaching part 126, a drawing of the two-dimensional data of the electric cable housing components that has the diagram showing the images of the components and the attribute information described in the vicinity of the diagram is completed.

The determination controller 121 uses the file output part 127 to display, on the display of the data output unit 112, the drawing of the two-dimensional data of the electric cable housing components as file-formatted data, the drawing of the two-dimensional data of the electric cable housing components being completed in the manner described above. The determination controller 121 also stores the drawing of the two-dimensional data of the electric cable housing components in the two-dimensional database 132 for the electric cable housing components that is provided in the storage unit 130 (a file output process S246). Note that the file output part 127 automatically applies a dimension line, background CAD data, key plan and the like when taking the drawing of the two-dimensional data of the electric cable housing components as file-formatted data.

Here, a specific data format of the drawing of the two-dimensional data of the electric cable housing components is typically a CAD format, but various data formats can be employed as long as the file-formatted data can be directly image-displayed by various application programs.

[Detail of Two-Dimensional Data Generation Process]

FIGS. 3 to 6 show, in the process flow of the drawing generation device 100 for the electric cable housing components shown in FIG. 2, flowcharts showing examples of flows of the diagram generation process (S242), line segment integration process (S243), coplanarization process (S244), and attribute information application process (S245) included in the two-dimensional data generation process (S240) which is a feature of the present invention. Hereinafter, these processes are described sequentially in detail with reference to FIGS. 3 to 6.

[Diagram Generation Process]

Figure 3:
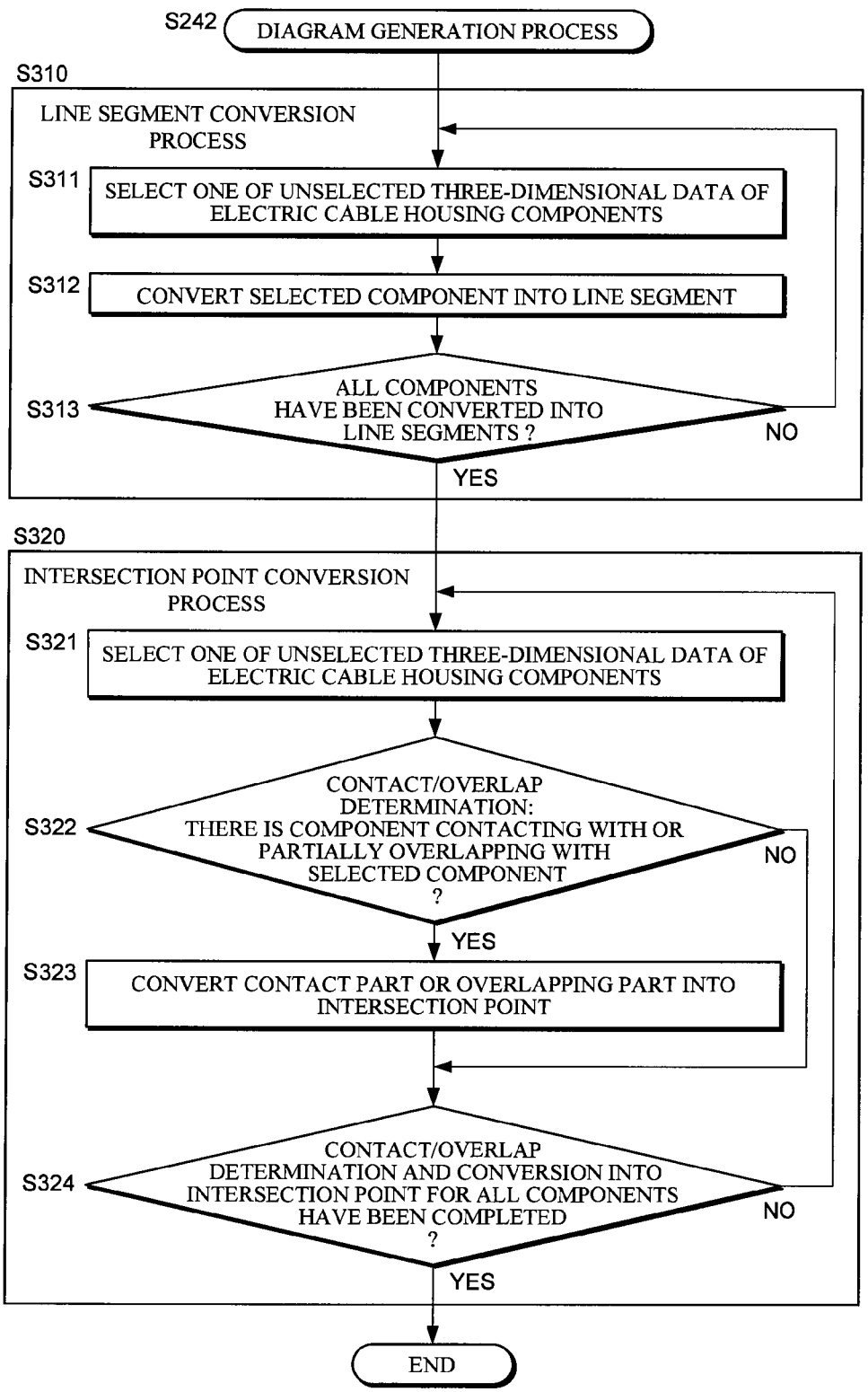
FIG. 3 is a flowchart showing an example of a flow of a diagram generation process shown in FIG. 2.

FIG. 3 is a flowchart showing an example of a flow of the diagram generation process (S242) performed by the diagram generation part 123. As shown in FIG. 3, in the diagram generation process (S242), the diagram generation part 123 first performs a line segment conversion process (S310). In this line segment conversion process (S310), the diagram generation part 123 selects, one by one, three-dimensional data of the electric cable housing components that are not yet selected during the line segment conversion process (S310) (S311), and converts trajectories of respective specific parts of the selected components into line segments (S312). In this case, the diagram generation part 123 repeatedly selects the components and converts the components into line segments (S311, S312) as long as the unselected components exist during the line segment conversion process (S310) (NO in S313).

The diagram generation part 123 ends the line segment conversion process (S310) at a point in time when all of the components are converted into line segments (YES in S313), and proceeds to an intersection point conversion process (S320).

In the intersection point conversion process (S320), the diagram generation part 123 selects, one by one, the three-dimensional data of the electric cable housing components that are not yet selected during the intersection point conversion process (S320) (S321), and determines the presence/absence of a component that is in a predetermined positional relationship with respect to the selected components, that is, "a component that is in contact with or partially overlapped with the selected components" (contact/overlap determination S322). When there is "a component that is in contact with or partially overlapped with the selected components," that is, when there is "a contact part between the components or a part where the components are partially overlapped with each other" (YES in S322), the contact part or the partially overlapped part is converted into an intersection point (S323). In this case, the diagram generation part 123 repeatedly performs the selection of the components, contact/overlap determination, and conversion into an intersection point (S321 to S323), as long as the unselected components exist during the intersection point conversion process (S320) (NO in S324).

The diagram generation part 123 ends the intersecting conversion process (S320) and the diagram generation process (S242) upon completion of the contact/overlap determination and the conversion into an intersection point that are performed on all of the components (YES in S324).

Figure 7:
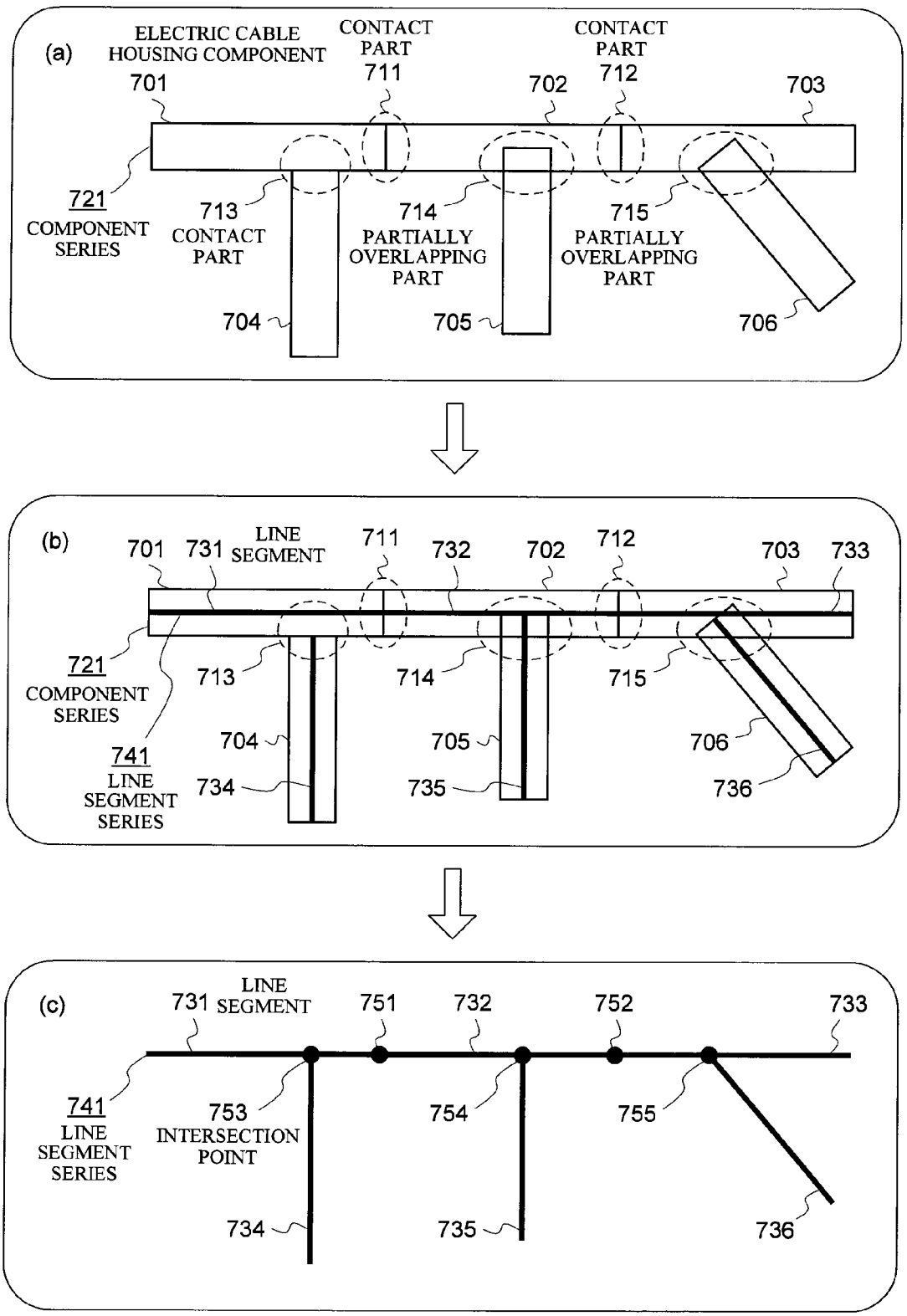
FIG. 7 is a diagram showing a specific example of the diagram generation process shown in FIG. 3.

FIG. 7 is a diagram showing a specific example of the diagram generation process (S242) described above. FIG. 7A is a plan view in which an example of the three-dimensional data of the electric cable housing components is viewed from above. In the three-dimensional data shown in FIG. 7A, three long electric cable housing components 701 to 703 are arranged in series to have the same vector, and are connected by bringing end parts of the adjacent components into contact with each other, thereby generating contact parts 711, 712 between the components. As a result, a component series 721 composed of the three electric cable housing components 701 to 703 of the same vector that are continuously arranged in series is formed.

Of the three electric cable housing components 701 to 703 forming the component series 721, in the vicinity of the electric cable housing component 701 on the left-hand side, another long electric cable housing component 704 is disposed in a direction perpendicular to the electric cable housing components 701 and is in contact with a side surface of the electric cable housing components 701 at one end part of the electric cable housing component 704, whereby a contact part 713 exists between the components.

Furthermore, in the vicinity of the electric cable housing component 702 in the middle of the component series 721, another long electric cable housing component 705 is disposed in a direction perpendicular to the electric cable housing component 702 and intersects with the electric cable housing component 702 at one end part of the electric cable housing component 705, whereby a partially overlapping part 714 exists between the components. Moreover, in the vicinity of the electric cable housing component 703 on the right-hand side of the component series 721, another long electric cable housing component 706 is disposed in a direction oblique to the electric cable housing component 703 and intersects with the electric cable housing component 703 at one end of the electric cable housing component 706, whereby a partially overlapping part 715 exists between the components.

The three-dimensional data of the electric cable housing components 701 to 706 shown in FIG. 7A are converted into the line segments for the components by the line segment conversion process (S310). Here, the a method for calculating a central line from the three-dimensional data of the shape of each component is employed as an example of a specific method for converting the three-dimensional data of the components into the line segments. In other words, this is merely a method for using the three-dimensional data of "the shape of each component" to convert "the shape," which is one of the "trajectories of specific parts of the components," into the central line which is one of the "line segment."

FIG. 7B shows a result obtained converting the three-dimensional data of the electric cable housing components 701 to 706 shown in FIG. 7A into line segments 731 to 736 for the components by calculating the central line of the components as described above. In FIG. 7B, the line segments 731 to 733 are the results obtained by converting the component series 721 composed of the three electric cable housing components 701 to 703, for each component, wherein a line segment series 741 is formed from these line segments 731 to 733.

Note that three-dimensional arrangement data of the electric cable housing that are generally generated include information on the trajectories of the components. Therefore, a method for converting the components into the line segments by directly using the information on the trajectories can be employed as another method for calculating the central line of the components.

The three-dimensional data of the electric cable housing components 701 to 706 shown in FIG. 7A are converted into the line segments 731 to 736 for the components by the line segment conversion process (S310) as shown in FIG. 7B. In addition to this, the contact parts 711 to 713 between the components or the partially overlapping parts 714, 715 are converted into intersection points 751 to 755 by the intersection point conversion process (S320), as shown in FIG. 7C.

Here, a method for determining the contact or overlapping part between the components on the basis of the shape of each component viewed from the plan view of the three-dimensional data is employed as an example of a specific method of the contact/overlap determination. Note that a tolerance for determining whether the components are in contact with each other or not is set beforehand in accordance with the size of the electric cable housing components. Furthermore, the left-hand side contact part 713 between the components, the right-hand side partially overlapping part 715 that are shown in FIG. 7B, or other section in which the line segment of the component subjected to the line segment conversion does not reach the intersection point is interpolated.

By the line segment conversion process (S310) and the intersection point conversion process (S320) described above, the three-dimensional data shown in FIG. 7A is converted into a diagram composed of the line segments 731 to 736 and the intersection points 751 to 755, as shown in FIG. 7C. As shown in FIG. 7C, only the converted diagram data composed of the line segments and intersection points is described as the drawing by the diagram generation process (S242), and the three-dimensional data to be converted is not described.

In addition, in FIG. 7C, a small circle is used as a symbol representing each intersection point, but this is merely an example. However, any other arbitrary symbols such as a triangle, square, or "x" mark, for example, can be used. Moreover, a plurality of types of symbols that are different in shape and size can also be used.

[Line Segment Integration Process]

Figure 4:
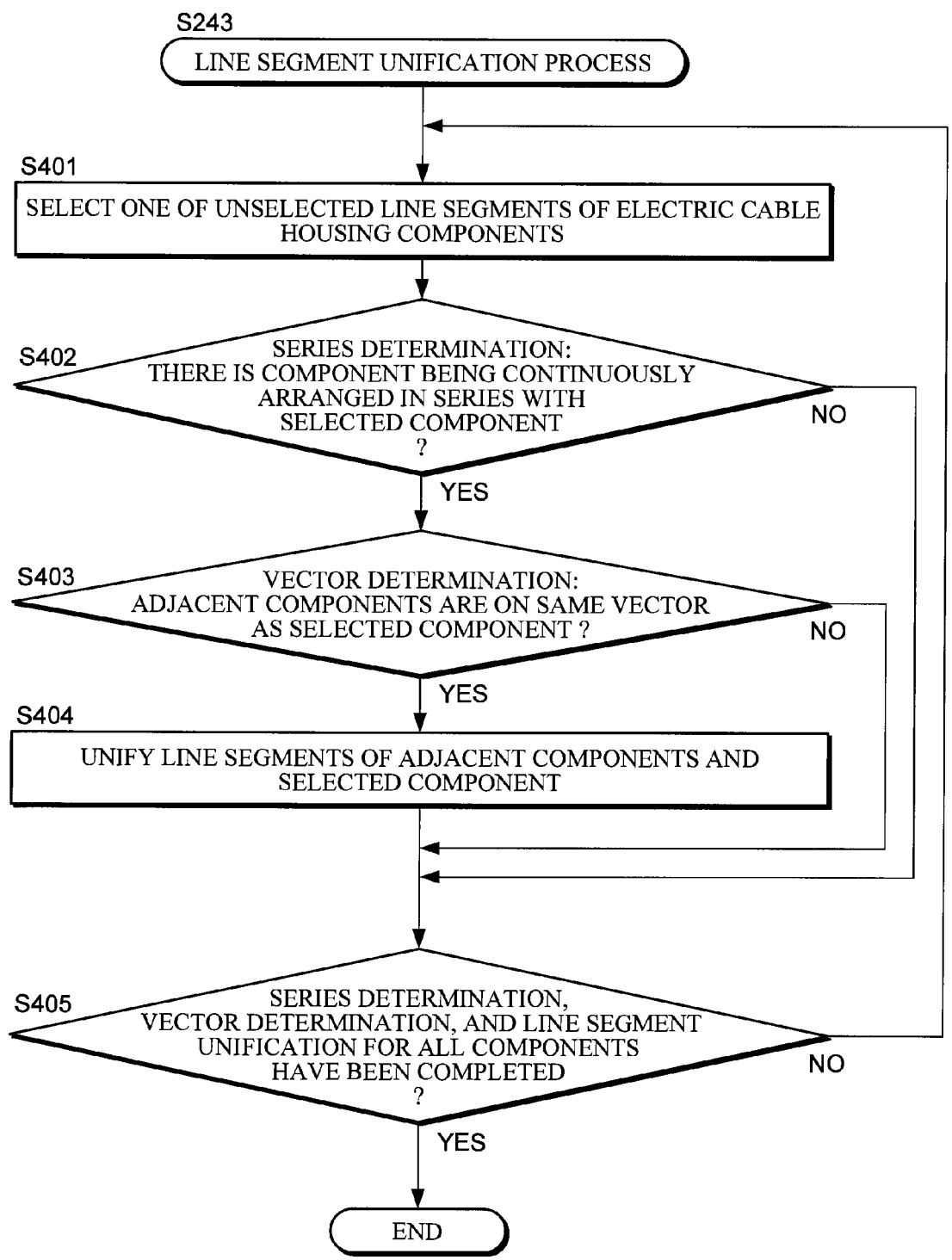
FIG. 4 is a flowchart showing an example of a flow of a line segment integration process shown in FIG. 2.

FIG. 4 is a flowchart showing an example of a flow of the line segment integration process (S243) performed by the line segment unification part 124. As shown in FIG. 4, in the line segment integration process (S243), the line segment unification part 124 selects, one by one, line segments of the electric cable housing components that are not yet selected during the line segment integration process (S243) (S401), and determines the presence/absence of "adjacent components that are continuously arranged in series with the selected components" (series determination S402).

Then, when "adjacent components that are continuously arranged in series with the selected components" exist (YES in S402), it is determined whether or not "the trajectories of specific parts of the adjacent components are on the same vector as the trajectories of specific parts of the selected components" (vector determination S403). Here, when "the adjacent components and the selected components are on the same vector," the line segments of the adjacent components and the line segments of the selected components are unified (S404). In this case the line segment unification part 124 repeatedly performs the selection of the components, series determination, vector determination, and line segment integration (S401 to S404) as long as the unselected components exist during the line segment integration process (S243) (NO in S405).

The line segment unification part 124 ends the line segment integration process (S243) upon completion of the series determination, vector determination and line segment integration performed on all of the components (YES in S405).

FIG. 8 is a diagram showing a specific example of the line segment integration process (S243). FIG. 8A is a perspective view in which an example of the three-dimensional data of the electric cable housing components is viewed from above. In the three-dimensional data shown in FIG. 8A, three rectangular solid electric cable housing components 801 to 803 are arranged in series so that the central lines thereof are on the same vector, and are also connected by bringing end parts of the adjacent components into contact with each other, thereby forming contact parts 811, 812 between the components. As a result, a component series 821 composed of the three electric cable housing components 801 to 803 of the same vector that are continuously arranged in series is formed.

The three-dimensional data of the electric cable housing components 801 to 803 shown in FIG. 8A is converted into a diagram composed of line segments 831 to 833 forming a line segment series 841 shown in FIG. 8B and intersection points 851, 852 between these line segments by the diagram generation process (S242) described above, and thereafter the line segment series 841 is unified into one line segment 861 by the line segment integration process (S243), as shown in FIG. 8C.

Here, a method for unifying a line segment series composed of "line segments of a plurality of components on the same vector that are continuously arranged in series" and deleting unnecessary intersection points between the plurality of components is employed as an example of specific methods for unifying the line segments in the diagram. FIG. 8C shows a result of unifying the line segments 831 to 833 of the plurality of components shown in FIG. 8B and deleting the intersection points 851, 852 to obtain one line segment 861 representing three components.

[Coplanarization Process]

Figure 5:
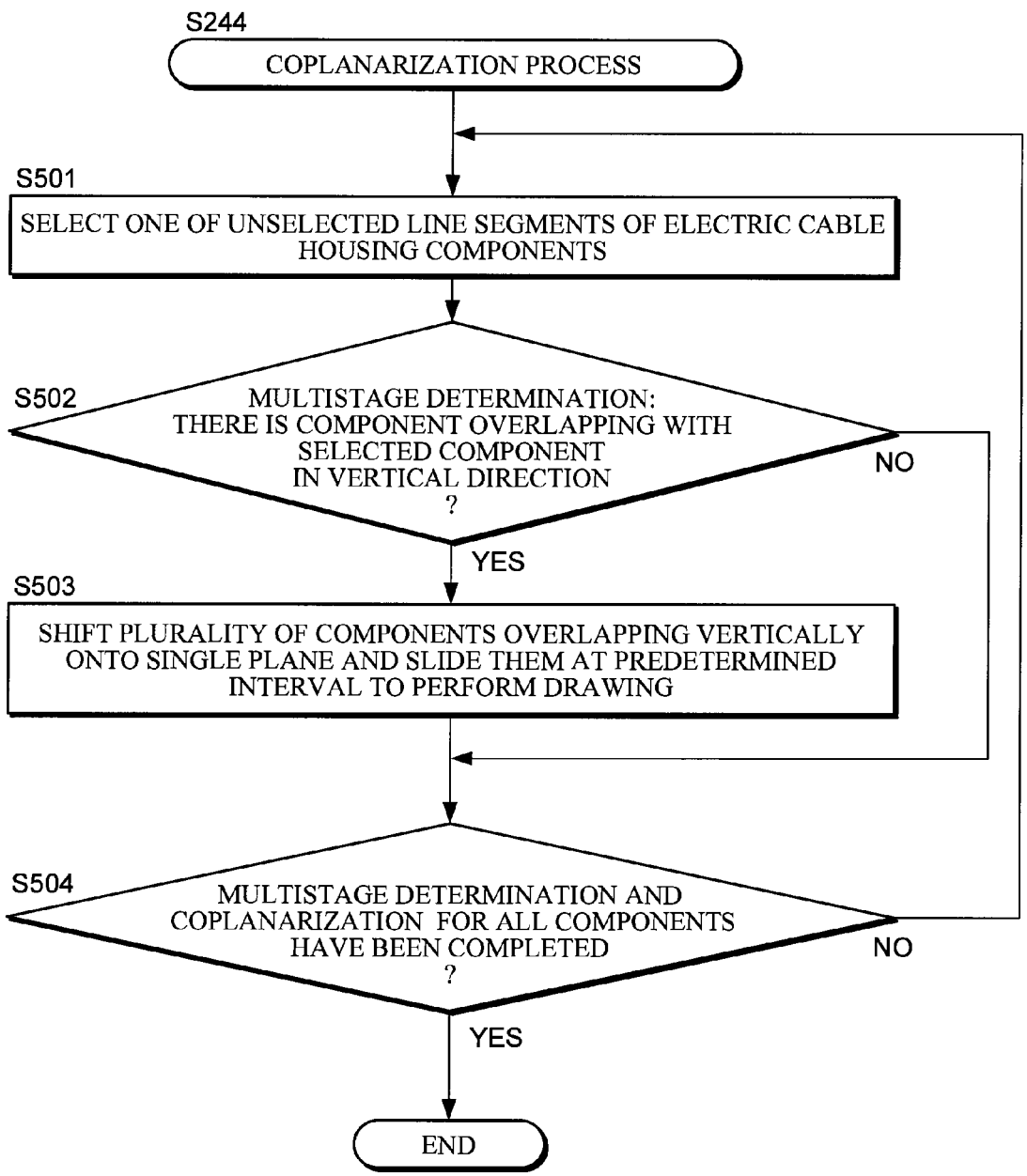
FIG. 5 is a flowchart showing an example of a flow of a coplanarization process shown in FIG. 2.

FIG. 5 is a flowchart showing an example of a flow of the coplanarization process (S244) performed by the coplanarization part 125. As shown in FIG. 5, in the coplanarization process (S244), the coplanarization part 125 selects, one by one, line segments of the electric cable housing components that are not yet selected during the coplanarization process (S244) (S501), and determines the presence/absence of "a component that is overlapped with the selected components in the vertical direction" (multistage determination S502).

When "a component that is overlapped with the selected components in the vertical direction" exists (YES in S502), the line segments of the overlapping component and the line segments of the selected components are moved on the same plane, and the vertically overlapped components are shifted onto the same plane to generate a drawing (S503). Here, "a predetermined interval" is an interval that is set beforehand in order to represent the vertical overlap, and an interval in which two line segments disposed at this predetermined interval can be identified visually and clearly. The coplanarization part 125 repeatedly performs the selection of the components, multistage determination, and coplanarization (S501 to S503) as long as the unselected components exist during the coplanarization process (S244) (NO in S504).

The coplanarization part 125 ends the coplanarization process (S244) upon completion of the multistage determination and coplanarization process performed on all of the components (YES in S504).

Figure 9:
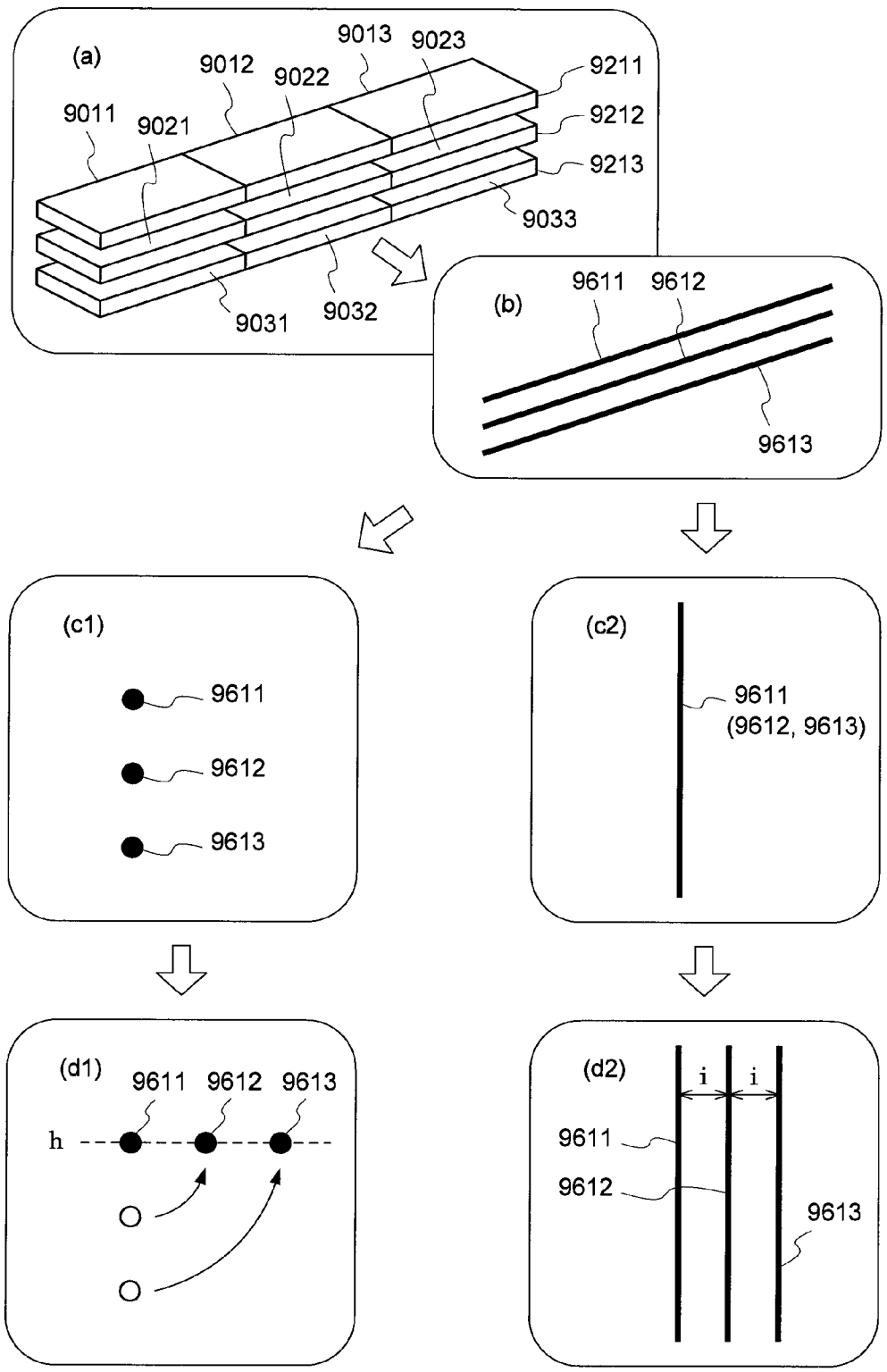
FIG. 9 is a diagram showing a specific example of the coplanarization process shown in FIG. 5.

FIG. 9 is a diagram showing a specific example of the coplanarization process (S244) described above. FIG. 9A is a perspective view in which an example of the three-dimensional data of the electric cable housing components is viewed from obliquely above. In the three-dimensional data shown in FIG. 9A, three stages of component series 9211 to 9213 are arranged so as to be overlapped with each other in the vertical direction, and these three stages of component series 9211, 9212, 9213 are composed respectively of three electric cable housing components 9011 to 9013, 9021 to 9023, and 9031 to 9033 of the same vector that are continuously arranged in series, as with the component series 821 shown in FIG. 8A.

The three-dimensional data of the three stages of component series 9211 to 9213 shown in FIG. 9A is processed by the diagram generation process (S242) and the line segment integration process (S243) described above, and, as a result, the three stages of component series 9211 to 9213 are unified into one line segment 9611 to 9613 respectively, as shown in FIG. 9B. At this point, the line segments of 9611 to 9613 of the three stages of component series 9211 to 9213 are overlapped with each other in the vertical direction when viewed from a cross section orthogonal to an axis, as shown in FIG. 9C1, and the line segments 9612, 9613 on the lower stage are overlapped with the line segment 9611 on the upper stage when viewed from the plane view, as shown in the plan view of FIG. 9C2.

From the phases shown in phases shown in FIGS. 9C1 and 9C2, the line segments 9611 to 9613 of the three stages of component series 9211 to 9213 that are overlapped with each other in the vertical direction are moved on the same plane by the coplanarization process (S244), as shown in FIGS. 9D1 and 9D2, and a drawing is generated by sliding the line segments at the predetermined interval to represent the vertical overlap.

Here, a method for shifting other line segments onto the same plane that is as high as one of the line segments of the plurality of vertically overlapped components, sliding the line segments on this plane at the predetermined interval, and arranging them in order of original height to generate a drawing is employed as an example of a specific method for sliding a plurality of vertically overlapped line segments onto the same plane to generate a drawing.

FIGS. 9D1 and 9D2 each shows a result of generating a drawing by shifting the middle and lower line segments 9612, 9613 onto the same plane having the same height h as the upper line segment 9611 out of the three line segments 9611 to 9613 that are overlapped in the vertical direction shown in FIGS. 9C1 and 9C2, sliding the line segments on this plane having the height h at a predetermined interval i, and arranging the line segments in order of original height (9611, 9612, 9613). Note that the height h of the plane to which the line segments are moved is set to, for example, "h=0," so that the data processing that is performed when the subsequent attribute information application process or file output process are performed can be carried out easily.

[Attribute Information Application Process]

Figure 6:
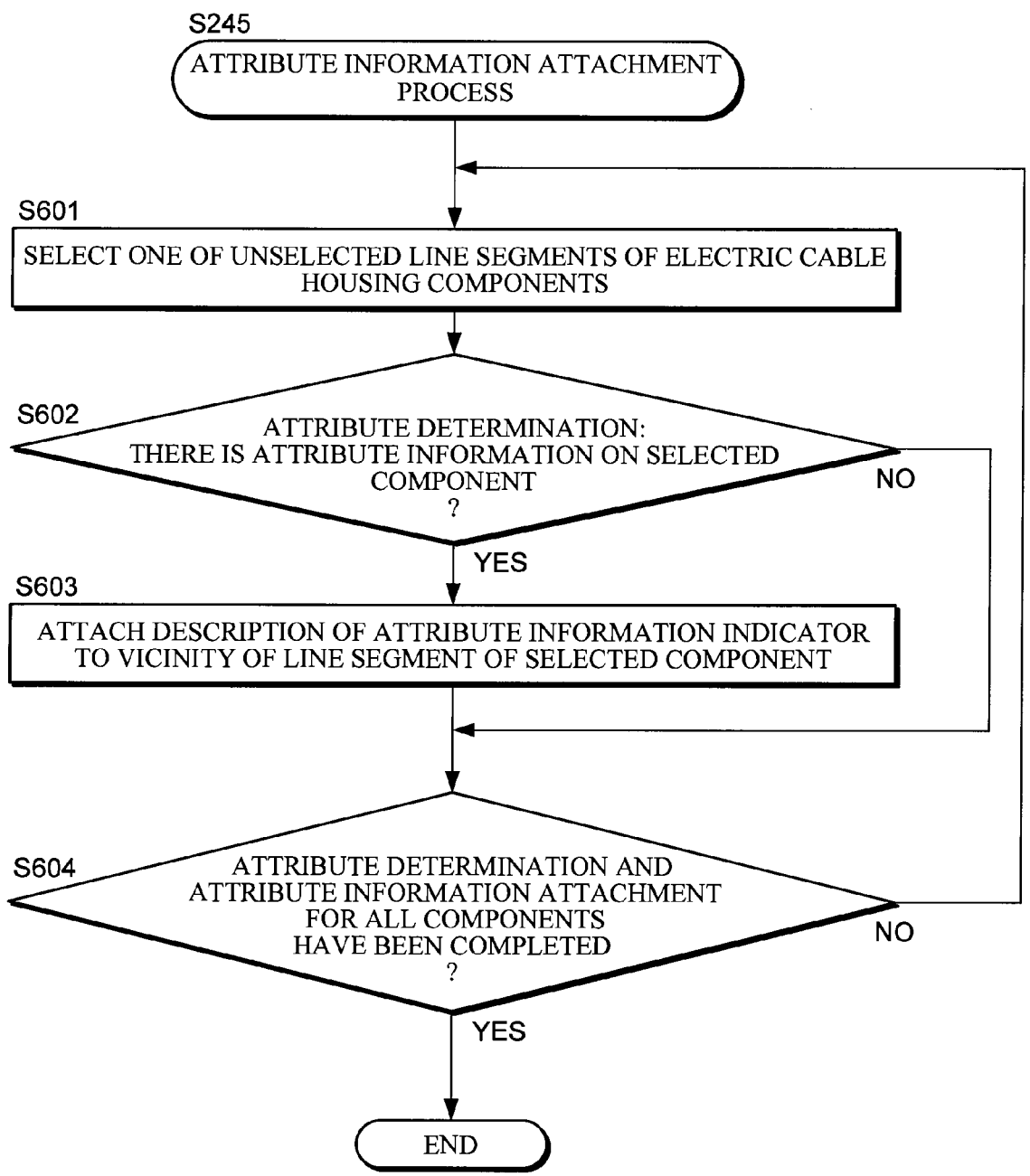
FIG. 6 is a flowchart showing an example of a flow of an attribute information application process shown in FIG. 2.

FIG. 6 is a flowchart showing an example of a flow of the attribute information application process (S245) performed by the attribute information attaching part 126. As shown in FIG. 6, in the attribute information application process (S245), the attribute information attaching part 126 selects, one by one, line segments of the electric cable housing components that are not yet selected during the attribute information application process (S245) (S601), and determines the presence/absence of "attribute information on the selected components" (attribute determination S602). Here, "attribute information" represents the attribute information included in the three-dimensional data of the electric cable housing components, and examples thereof include the route number, route type, the height of each component in the vertical direction, and the like.

When the "attribute information on the selected components" exist (YES in S602), the descriptions of the attribute information indicators representing the attribute information are attached to the vicinity of the line segments of the selected components (S603). Here, the "attribute information indicator" is an image indicator configured by a character string, code, symbol mark, figure, or at least two combinations thereof, in order to represent the attribute information. The attribute information attaching part 126 repeatedly performs the selection of the components, attribute determination, and attribute information application (S601 to S603) as long as the unselected components exist during the attribute information application process (S245) (NO in S604).

The attribute information attaching part 126 ends the attribute information application process (S245) upon completion of the attribute determination and the attribute information application performed on all of the components (YES in S604).

Figure 10:
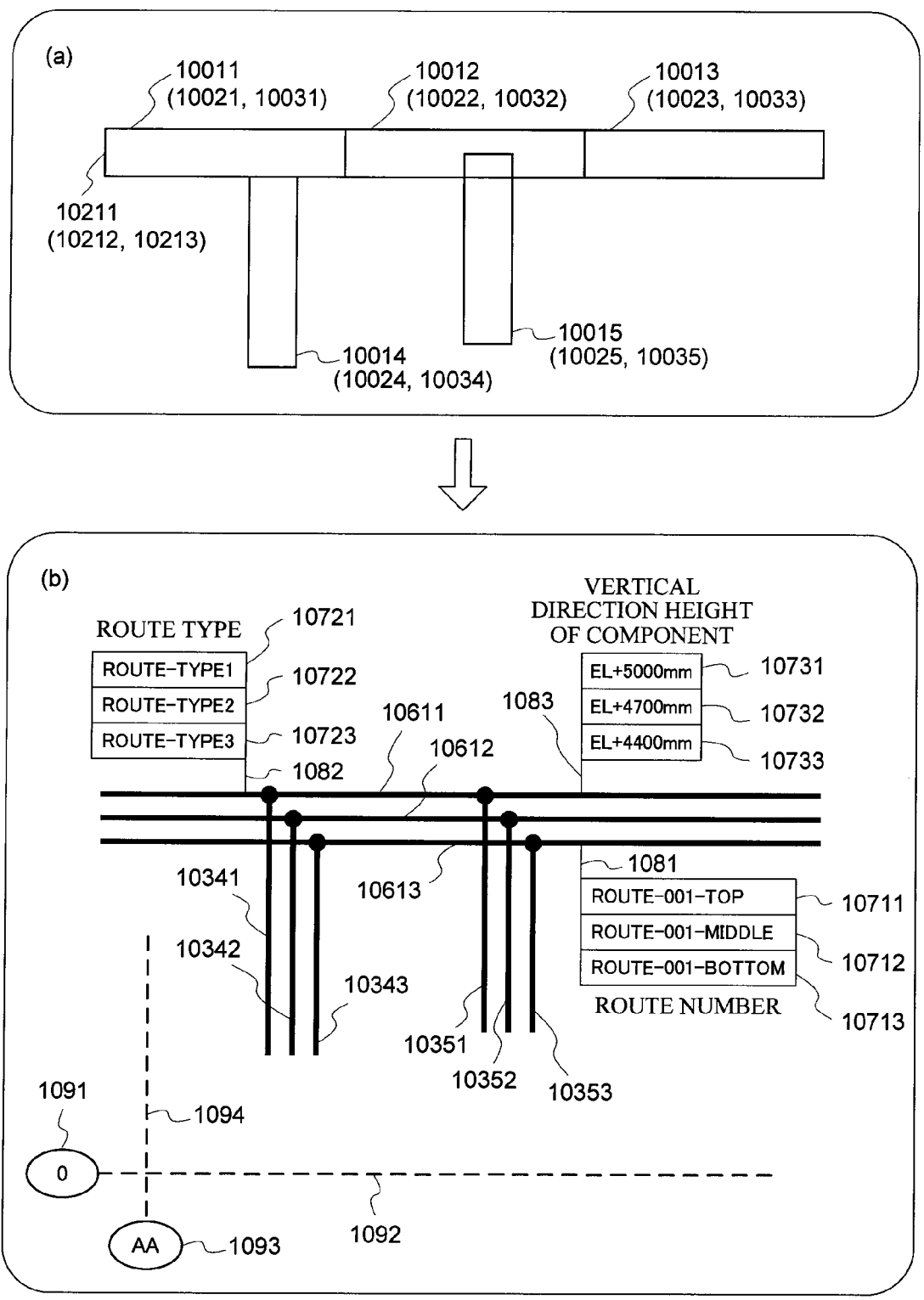
FIG. 10 is a diagram showing a specific example of the attribute information application process shown in FIG. 6.

FIG. 10 is a diagram showing a specific example of the attribute information application process (S245). FIG. 10A is a plan view in which an example of the three-dimensional data of the electric cable housing components is viewed from above. In the three-dimensional data shown in FIG. 10A, three stages of component series 10211 to 10213 are arranged so as to be overlapped with each other in the vertical direction, and these three stages of component series 10211, 10212, 10213 are composed respectively of three electric cable housing components 10011 to 10013, 10021 to 10023, and 10031 to 10033 of the same vector that are continuously arranged in series, as with the component series 9211 to 9213 shown in FIG. 9A.

In the vicinity of the three electric cable housing components 10011, 10021, 10031 on the left-hand side that form the three stages of component series 10211 to 10213 respectively, similarly three electric cable housing components 10014, 10024, 10034 are arranged in a direction perpendicular to the electric cable housing components 10011, 10021, 10031 and are in contact with side surfaces of the same electric cable housing components 10011, 10021, 10031 at one end parts of the electric cable housing components 10014, 10024, 10034.

Moreover, in the vicinity of the middle three electric cable housing components 10012, 10022, 10032 that form the three stages of component series 10211 to 10213 respectively, similarly three electric cable housing components 10015, 10025, 10035 are arranged in a direction perpendicular to the electric cable housing components 10012, 10022, 10032 and intersect with the same electric cable housing components 10012, 10022, 10032 at one end parts of the electric cable housing components 10015, 10025, 10035.

The three-dimensional data of the three stages of component series 10211 to 10213, three-dimensional data of the three electric cable housing components 10014, 10024, 10034 contacting with the left side parts of the component series 10211 to 10213, and the three-dimensional data of the three electric cable housing components 10015, 10025, 10035 intersecting with the central parts of the component series 10211 to 10213 shown in FIG. 10A are processed by the diagram generation process (S242), the line segment integration process (S243), and the coplanarization process (S244) described above.

As a result, as shown in FIG. 10B, each of the three stages of component series 10211 to 10213 is unified to each of segments 10611 to 10613, shifted on the same plane at the predetermined interval, and arranged in order of original height, whereby a drawing is generated. In addition, the three electric cable housing components 10014, 10024, 10034 contacting with the left side parts of the three stages of component series 10211 to 10213, and the three electric cable housing components 10015, 10025, 10035 intersecting with the central parts of the component series 10211 to 10213 are respectively converted into line segments 10341 to 10343 and 10351 to 10353, shifted onto the same plane at the predetermined interval, arranged in order of original height of the three stages of component series 10211 to 10213, whereby a drawing is generated.

After this coplanarization process (S244), in the attribute information application process (S245), the attribute information indicators representing the attribute information are attached to the vicinity of the line segments of the components having the attribute information as shown in FIG. 10B. In FIG. 10B, as an example of the attribute information indicators, route number indicators 10711 to 10713 representing the route numbers, route type indicators 10721 to 10723 representing the route types, and vertical direction height indicators 10731 to 10733 representing the vertical direction height of the components are attached to the line segments 10611 to 10613 of the component series.

These attribute information indicators 10711 to 10713, 10721 to 10723, and 10731 to 10733 are configured by character strings and boxes enclosing the character strings and are described in the same order as the corresponding line segments 10611 to 10613 (therefore, the same order as the order of the original height of the three stages of component series 10211 to 10213), with no space between the boxes.

Moreover, out of the route number indicators 10711 to 10713, the box of the indicator 10711 closest to the corresponding line segments 10611 to 10613 and the line segment 10613 closest to this box are connected with each other via a lead line 1081. Similarly, out of the route type indicators 10721 to 10723, the box of the indicator 10723 closest to the corresponding line segments 10611 to 10613 and the line segment 10611 closest to this box are connected with each other via a lead line 1082. Similarly, out of the vertical direction height indicators 10731 to 10733, the box of the indicator 10733 closest to the corresponding line segments 10611 to 10613 and the line segment 10611 closest to this box are connected with each other via a lead line 1083.

In addition, as shown in FIG. 10B, in the attribute information application process (S245), a base line information indicator representing base line information or column center information of a building structure may be positionally associated with the electric cable housing components and attached. In the example shown in FIG. 10B, a column center information indicator of a column name "0" configured by a label 1091 showing the column name and a broken line 1092 showing the column center, and a column center information indicator of a column name "AA" configured by a label 1093 showing the column name and a broken line 1094 showing the column center are attached, as an example of base line information indicator.

[Effect]

According to the drawing generation device for electric cable housing components of the present embodiment described above, the following effects are obtained.

First, according to the present embodiment, a simple diagram composed of the line segments and intersection points can be generated automatically from the three-dimensional data of the electric cable housing components, while holding the information on the contact and partial overlap between the components in the three-dimensional data. Then, by sliding the vertically overlapped components on a single plane to generate a drawing, a drawing that is useful as the two-dimensional data can be easily generated to clearly represent the relationship between the vertically overlapped components. In addition, the generated drawing of the electric cable housing components can be automatically output in its state that is useful as the two-dimensional data, and can be also output on a screen or printed out. The drawing can be also stored in the storage means so that it can be output any time if necessary.

Therefore, the present embodiment can provide a drawing generation device, method and program for electric cable housing components, which are capable of using three-dimensional data of electric cable housing components to automatically generate and output a drawing that is simple and useful as two-dimensional data for clearly representing the relationship between upper and lower components. As a result, a laborious work of manually generating a drawing of the two-dimensional data becomes unnecessary, and therefore a heavy burden on a designer can be reduced significantly.

In addition, in the present embodiment, because the three-dimensional arrangement adjustment CAD unit 140 for generating the three-dimensional data of the electric cable housing components in response to a data input from the user is provided within the drawing generation device 100 for electric cable housing components, the designer can directly use the three-dimensional data on the drawing generation device 100 after generating the three-dimensional data of the electric cable housing components on the same device 100 for electric cable housing components, and generate a drawing useful as the two-dimensional data. Therefore, when generating a drawing in which the three-dimensional data of the electric cable housing components is used, a laborious work of transmitting the three-dimensional data to and from the devices becomes unnecessary, resulting in excellent work efficiency.

In addition, according to the present embodiment, in the diagram generation process (S242) performed by the diagram generation part 123, the calculation of a central line from the shape of each electric cable housing component is performed on the three-dimensional data of the electric cable housing components, and a drawing of the components is generated by taking the calculated central line as the information on the line segments. Therefore, the present embodiment has an advantage of easily and automatically generating the line segments of the shape of the electric cable housing components.

Regarding the "trajectories of specific parts" of the electric cable housing components that are converted into the information on the line segments, not only the shape of each electric cable housing component but also, for example, both end surfaces of each long component in a longitudinal direction may be taken as the "trajectories of specific parts" and converted into the information on the line segments. Furthermore, as described above, the information on the trajectories of the components that are generally included in the three-dimensional arrangement data of the electric cable housing components may be directly used to convert the components into the line segment.

Also, according to the present embodiment, in the diagram generation process (S242) performed by the diagram generation part 123, when the contact part between the components or the partially overlapped part between the components is converted into an intersection point, it is determined, based on the preset tolerance (setting range), whether the components are brought into contact with each other. When the size of the part is within the range of the tolerance, the components are recognized as continuous electric cable housing components, the intersection point between the components is calculated, and a symbol serving as the intersection point is inserted. With this method, the contact part between the components or the partially overlapped part between the components can be extracted easily and automatically, and mechanically converted into the intersection point. Therefore, a laborious work for the user to extract the contact part between the components or the partially overlapped part between the components can be eliminated, resulting in excellent work efficiency.

In the diagram generation process (S242) performed by the diagram generation part 123 of the present embodiment, when the line segment of a branch part does not reach the intersection point with the line segment of a mainstream component, the line segment of the branch part is extended up to the line segment of the mainstream component to interpolate the branch part. With this method, in the case where a discontinuous part between line segments is generated in the contact part between the components or the partially overlapped part between the components when converting the components into the line segments, this discontinuous part can be interpolated automatically and made continuous. As a result, regardless of the line segment conversion method, the diagram obtained after the conversion can be provided with continuity that conforms with the original continuity between the components.

According to the present embodiment, in the line segment integration process (S243) performed by the line segment unification part 124, when the three-dimensional data of a plurality of electric cable housing components are continuously arranged in series, the line segments of the plurality of components in the diagram generated in the diagram generation process (S242) by the diagram generation part 123 is unified. With this method, because the diagram can be simplified by unifying the line segments of the plurality of components that are continuously arranged in series, the efficiency of the subsequent processes can be improved, which leads to a simplification of the two-dimensional data that are eventually generated.

Especially in the line segment integration process (S243) performed by the line segment unification part 124 of the present embodiment, when the three-dimensional data of the plurality of electric cable housing components are continuously arranged in series and the central lines of the plurality of components (trajectories of the specific parts) have the same vector, the line segments of the plurality of components in the diagram generated by the diagram generation process (S242) are unified into one line segment, and unnecessary intersection points between the plurality of components are deleted. This method enables a significant simplification process of unifying the line segments of the plurality of components that are continuously arranged in series and have the same vector into one line segment having no intersection point. Therefore, the efficiency of the subsequent processes can be improved, which leads to a further simplification of the two-dimensional data that are eventually generated.

In addition, according to the present embodiment, in the coplanarization process (S244) performed by the coplanarization part 125, when the three-dimensional data of the plurality of electric cable housing components are overlapped in the vertical direction, other line segments are moved onto the same plane having the same height as the height of one of the line segments of the plurality of components, and the line segments are shifted on this plane at the predetermined interval and arranged in order of original height of the components, to generate a drawing. With this method, all of the line segments can be moved onto the same plane simply by changing the height of some line segments without changing the height of all line segments. Moreover, because the line segments can be arranged in order of original height of the components on the plane to which the line segments are moved, the relationship between upper and lower components can be represented visually and clearly with the order of the arranged line segments.

Furthermore, according to the present embodiment, in the attribute information application process (S245) performed by the attribute information attaching part 126, the descriptions of the attribute information indicators representing the attribute information of the three-dimensional data of the electric cable housing components are attached to the vicinity of the line segments of the components. Accordingly, the attribute information of the necessary components can be automatically described in the vicinity of these components in response to a request for the two-dimensional data obtained eventually. As a result, a drawing that is more useful as the two-dimensional data can be generated.

In the attribute information application process (S245) performed by the attribute information attaching part 126 of the present embodiment, the attribute information indicators of the plurality of vertically overlapped components are arranged in the same order as the order of primary height of the components, as with the line segments of these components. With this method, not only is it possible to visually and clearly represent the vertical relationship between the plurality of vertically overlapped components, but also it becomes possible to visually and clearly represent the correlation between the described attribute information indicators and the plurality of components. As a result, a drawing that is more useful as the two-dimensional data can be generated.

In the attribute information application process (S245) performed by the attribute information attaching part 126 of the present embodiment, the attribute information indicators described in the vicinity of the line segments of the electric cable housing components are connected to the line segments via the lead lines. With this method, even when the plurality of components are arranged relatively close to each other as shown in FIG. 10B, the correlation between each component and the relevant attribute information indicator can be represented clearly by the lead line therebetween. Note that the example in FIG. 10B shows the straight lead lines, but the shape of the lead lines may not be straight and therefore can be a combination of straight lines extending in different directions, curves, a combination of straight lines and curves, or any shape.

[Specific Examples Related to Generation of Data of Electric Cable Housing Components for Cables]

Hereinafter, "Detail of Method for Generating Three-dimensional Data" for generating data of a electric cable housing component of a cable for connecting the machines of a power plant by means of the above-described drawing generation device for electric cable housing components according to the present embodiment, "Example of Generating Three-dimensional Data" as a result of the abovementioned data generation, and "Example of Generating Two-dimensional Data Using Three-dimensional Data" are described in detail.

[Detail of Method for Generating Three-Dimensional Data]

First, a method for generating the three-dimensional data of electric cable housing components is described in detail.

An interactive process between the designer and the computer is performed by the three-dimensional arrangement adjustment CAD unit 140 using a three-dimensional CAD operation screen, to generate the three-dimensional data of the electric cable housing components (the three-dimensional model data generation process S210). The individual three-dimensional models are generated into simple basic shapes such as a rectangular solid, angled elbow, cylinder, and circular elbow. Of the electric cable housing components, a cable tray is generated using a rectangular solid and an angled elbow. On the other hand, a duct is generated using a cylinder and a circular elbow.

The designer selects and dispose the three-dimensional model of an appropriate component in an appropriate position in a three-dimensional space represented on the three-dimensional CAD operation screen, and thereby generates the arrangement data of the three-dimensional data (the three-dimensional arrangement data generation process S220). Here, the designer generates the arrangement data of the three-dimensional models of the electric cable housing components by arranging the three-dimensional models in consideration of the size, planar position, height and angle of each component.

Regarding the cable tray and the duct, when generating the three-dimensional data of the electric cable housing components (S210, S220), the sizes used for designing and delivering the cable tray and the duct are input. Therefore, even with the sections of the cable tray that are simply stretched into straight lines, these sections are divided according to the size of the cable tray, and the rectangular solids are arranged in series to simulate the cable tray with the three-dimensional data. Similarly, a section of the duct that needs to be connected by welding is divided, and the cylinders are arranged in series, to generate the three-dimensional data.

When connecting the components, although the components are arranged by surface contact, the components are often partially overlapped (overlapped) and arranged without using surface contact, depending on the spatial conditions, such as an inclination, branching, oblique arrangement, and the like. Conversely, a fastener component is taken into consideration and the components can be often arranged via a gap therebetween without bringing them into contact with each other. In this manner, because the components are connected in different patterns by bringing the components into surface contact with each other, overlapping the components together, or by forming a gap between the components, the tolerance needs to be set for each of these patterns, when converting each component into a line segment in the two-dimensional data generation process using the three-dimensional data of the electric cable housing components, the process having these patterns.

Moreover, when generating the three-dimensional data of the electric cable housing components, the designer uses an attribute information input function provided normally in the three-dimensional arrangement adjustment CAD, to input the attribute information of each component. Specifically, the attribute information such as the route number, route type, and vertical direction height of each electric cable housing component are input, and the attribute information are stored in the three-dimensional database 131 of the electric cable housing components as a part of the three-dimensional data of the electric cable housing components, along with the three-dimensional model data and three-dimensional arrangement data of the electric cable housing components. Note that the "route type" is changed accordingly depending on the voltage or other conditions.

In this manner, the three-dimensional data of the electric cable housing components is generated. The generated three-dimensional data is preferably treated as CAD data and has a format that can be read by other application software. Therefore, the generated three-dimensional data is specifically output in the form of spreadsheet so that various other application software can read is as data. As a result, the generated three-dimensional data can be used in, for example, amount cumulation of the electric cable housing components.

[Example of Generating Three-Dimensional Data]

Figure 11:
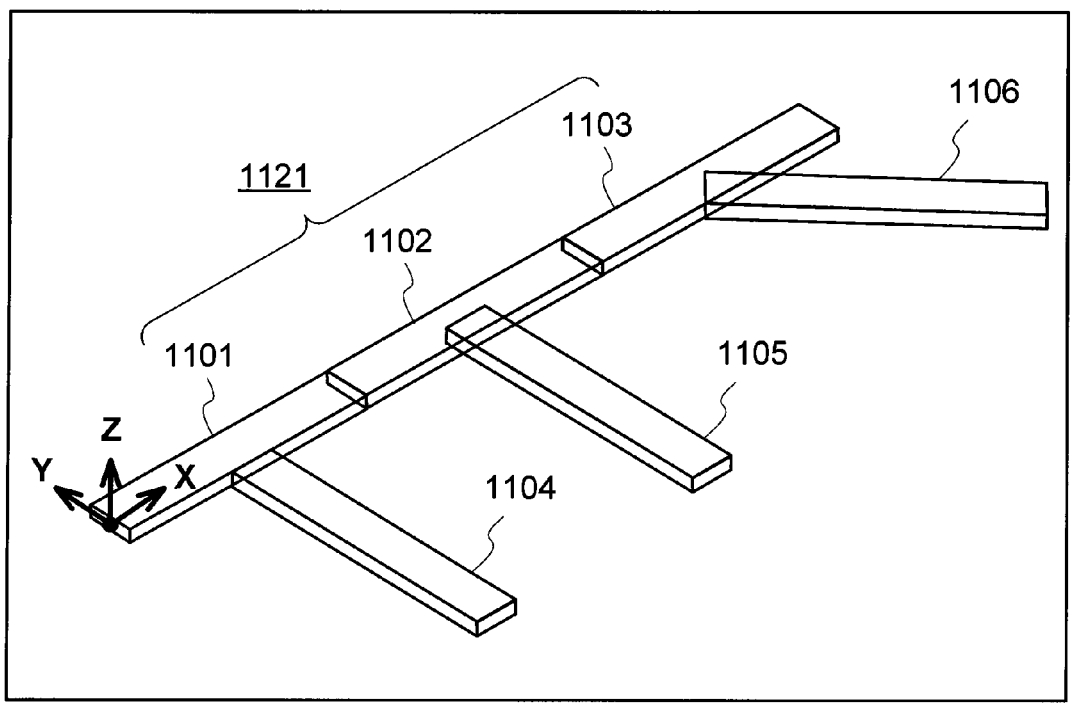
FIG. 11 is a perspective view in which an example of three-dimensional data of electric cable housing components generated by a three-dimensional arrangement adjustment CAD unit shown in FIG. 1 is viewed from obliquely above.
Figure 12:
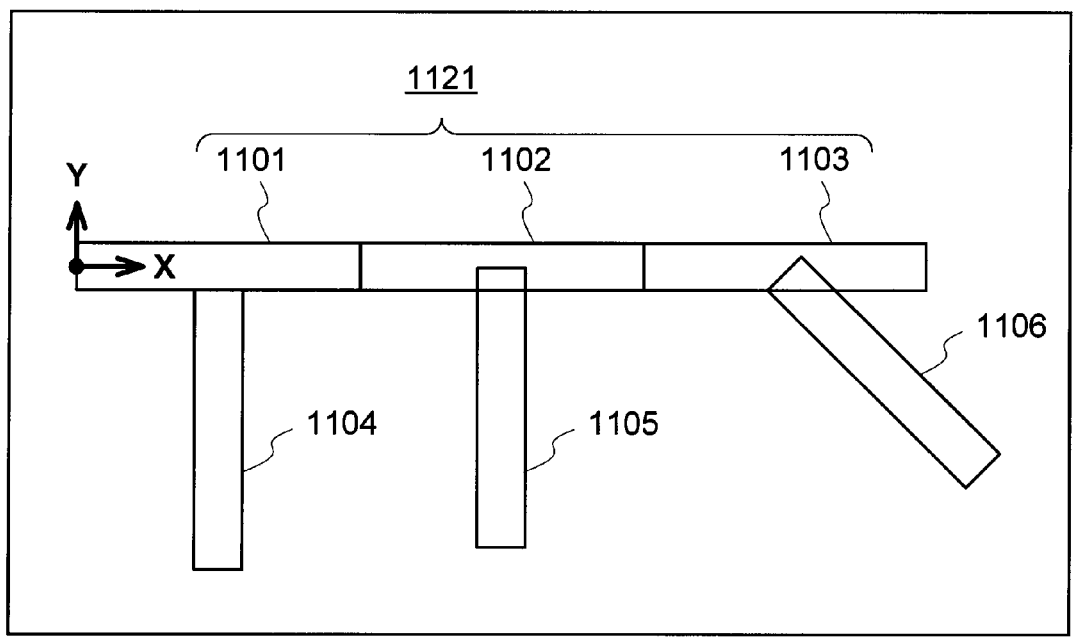
FIG. 12 is an XY plan view in which the three-dimensional data shown in FIG. 11 is viewed from above.

FIGS. 11 and 12 each shows an example of the three-dimensional data of the electric cable housing components that are generated by the formation method described above using the three-dimensional arrangement adjustment CAD unit 140. FIG. 11 is a perspective view in which this example of the three-dimensional data is viewed from obliquely above, and FIG. 12 is an XY plan view in which this example of the three-dimensional data is viewed from a Z-axis direction (above). In the three-dimensional data shown in FIGS. 11 and 12, three rectangular solid electric cable housing components 1101 to 1103 are arranged in series on the XY plane so that the central lines of these electric cable housing components are on the same vector, and end parts of the adjacent components are made continuous by coming into contact with each other, whereby a component series 1121 is formed in an X-axis direction.

Out of the three electric cable housing components 1101 to 1103 forming the component series 1121 in the X-axis direction, in the vicinity of the left-hand side electric cable housing component 1101, another rectangular solid electric cable housing component 1104 is disposed in a Y-axis direction (minus direction) which is a direction perpendicular to the electric cable housing component 1101, and one of the end parts of the electric cable housing component 1104 is in contact with a side surface of the electric cable housing component 1101.

In the vicinity of a central electric cable housing component 702 of the component series 1121, another rectangular solid electric cable housing component 1105 is disposed in the Y-axis direction (minus direction) which is a direction perpendicular to the electric cable housing component 1102, and this electric cable housing component 1105 intersects with the electric cable housing component 1102 such as to partially overlap with the electric cable housing component 1102 at one of end parts of the electric cable housing component 1105. In addition, in the vicinity of the right-hand side electric cable housing component 1103 of the component series 1121, another rectangular solid electric cable housing component 1106 is disposed in a direction oblique to the electric cable housing component 1103 (a direction at an angle of 45 degrees between the plus direction of the X-axis and the minus direction of the Y-axis), and intersects with the electric cable housing component 1103 so as to partially overlap therewith at one of end parts of the electric cable housing component 1106.

FIG. 13 is a diagram showing a data example obtained when the three-dimensional data shown in FIGS. 11 and 12 is output in the form of spreadsheet. The first line of the spreadsheet describes, as title information, the name of a electric cable housing component (Part Name), component category (Part Category), component number (Piece No.), geometric configuration (Geometry), reference line (Reference Line), arrangement coordinates (Coordinates), length/bending radius (Length or Bending radius), width/diameter (Width or Diameter), height/bending angle (Coordinates), yaw angle (Yaw-Angle), pitch angle (Pitch-Angle), roll angle (Roll-Angle), color (Color), trajectory (Trajectory), route number (Route No.), and the like.

The second line of the spreadsheet shown in FIG. 13 describes group starting information of a cable tray called "CABLETRAY_201" as component number "0." The group starting information of this component number "0" takes the geometric configuration as "zero point (0 PT: 0 point)" and the values of the component arrangement coordinates (x, y, z) as (0, 0, 0), and describes the component size (length/width/height) as "not applicable (NA: not applicable)," to show that the starting points of cable tray groups "1" to "6" described in the third line and the subsequent lines are (0, 0, 0).

The third line and the subsequent lines in the spreadsheet shown in FIG. 13 describe the three-dimensional data of the total of six cable trays called "CABLETRAY_201," which are attached with the component numbers "1" to "6." Specifically, these lines describe that the geometric configuration of each of the cable trays is "BOX," "not applicable (NA: not applicable)" for the reference line, and the values of the component arrangement coordinates. Furthermore, for each of the cable trays, values of the component size (length/width/height), and the value of the rotation angles of each component (yaw angle, pitch angle, roll angle) are described. There are also described "YELLOW" as the component colors, "median of coordinates (MC: median of coordinates)" as the trajectories, and "SAMPLE201" as the route numbers are described for the cable trays.

[Example of Generating Two-Dimensional Data Using Three-Dimensional Data]

As described above, the three-dimensional data generated by the three-dimensional arrangement adjustment CAD unit 140 is output in the form of the spreadsheet shown in FIG. 13 so as to be read by other application software, whereby the names, component size, component arrangement coordinates, angles, and other information of the electric cable housing components can be read. In this case, because the first line of the spreadsheet describes the title information as shown in FIG. 13, the determination controller 121 of the two-dimensional data generation unit 120 can determine the item described in each line on the basis of the title information.

As described above, the determination controller 121 of the two-dimensional data generation unit 120 displays the GUI screen, supports the input of an instruction of the two-dimensional data generation start from the user, and starts the series of two-dimensional data generation processes (S240 in FIG. 2) in response to the instruction of the two-dimensional data generation start that is input by the user. Specifically, a list of file names of the three-dimensional data are displayed on the GUI screen, a file name is selected by the user, and the instruction of the two-dimensional data generation start for the selected three-dimensional data is supported, whereby the spreadsheet having all three-dimensional data selected by the user is read.

With the two-dimensional data generation starting method described above, the spreadsheet having all three-dimensional data selected by the user can be read at once and processed at once so that the two-dimensional data can be generated at once. Therefore, even when files of the three-dimensional data are generated according to the component type or route type, the three-dimensional data of the plurality of files are processed at once to generate the two-dimensional data at once.

FIG. 14 is a perspective view in which an example of the three-dimensional data of the electric cable housing components generated by the method for generating three-dimensional data described above by means of the three-dimensional arrangement adjustment CAD unit 140 is viewed from obliquely above. In the three-dimensional data shown in FIG. 14, four electric cable housing components 1401 to 1404 of the same shape are overlapped with each other in the vertical direction.

Figure 15:
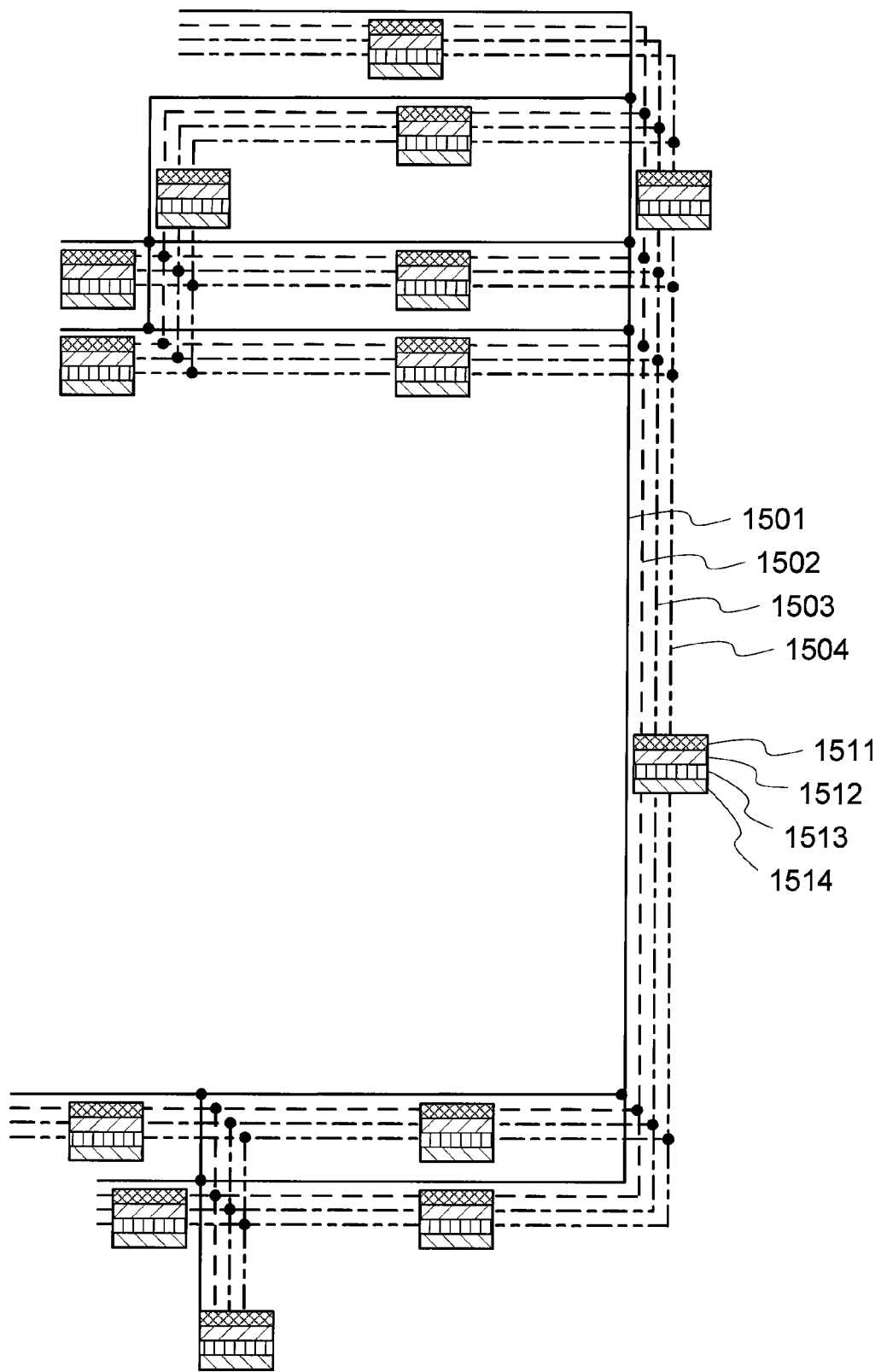
FIG. 15 is a diagram showing an example of a drawing of two-dimensional data that is generated from the three-dimensional data shown in FIG. 14.

FIG. 15 is a diagram showing an example of a drawing of two-dimensional data that is generated from the three-dimensional data shown in FIG. 14. The drawing of the two-dimensional data shown in FIG. 15 is subjected to the series of two-dimensional data generation processes (S240) by the two-dimensional data generation unit 120 and, as a result, output in the form of CAD file or the like by the file output part 127.

In the drawing of the two-dimensional data shown in FIG. 15, line segments 1501 to 1504 of components corresponding to the four electric cable housing components 1401 to 1404 shown in FIG. 14 are shifted at the predetermined interval and arranged in order of the original height by the coplanarization part 125 to represent the vertical overlap. These line segments are also separated by unique color for each stage height of component. In the line segments 1501 to 1504 shown in FIG. 15, the difference between the unique colors of respective stage heights of components is represented by a difference in pattern, such as a solid line, broken line, dashed line, and two-dot chain line.

In addition, in the vicinity of each of the line segments 1501 to 1504 of components of respective stage heights, the descriptions of attribute information indicators 1511 to 1514 of the components representing the route types and other attribute information are attached by the attribute information attaching part 126 in the same order as the line segment. These attribute information indicators 1511 to 1514 also are separated by unique color for each stage height of component such that the color of each indicator is the same as the line segment to which the indicator attached. In the attribute information indicators 1511 to 1514 shown in FIG. 15, the difference between the unique colors is represented by a difference in color-filling pattern.

By using this output pattern, the user can easily confirm where on the layout the electric cable housing components shown by the line segments are arranged. Particularly, because the components that are overlapped with each other in the vertical direction are slided at the predetermined interval so that they are not overlapped with each other and can be seen clearly, the layout is not represented accurately. However, it is noticeable in which section an electric cable housing component of a certain attribute is installed, by using the route type or other attribute information indicator. Therefore, this method is effective in a construction site.

Moreover, by separating the line segments and attribute information indicators of the components by means of unique colors for respective stage heights of components as shown in the example of FIG. 15, the relationship between the upper and lower components can be represented more clearly even in a section where the line components or attribute information indicators of the plurality of components are arranged in proximity. Therefore, the vertical relationship between the components can be effectively prevented from being confused.

The drawing of the two-dimensional data of the electric cable housing components shown in FIG. 15 is extremely effective as review data for checking, for example, an interference in equipment, steel skeletons, building structures, pipes, and other components in order to perform a prior confirmation before carrying out an actual construction. This drawing is also extremely effective in overlapping and viewing the three-dimensional data or two-dimensional data of a group of such components on the screen, or in checking the interference by means of automatic processing.

Other Embodiments

The present invention is not limited to the embodiments described above, and therefore various modifications can be implemented within the scope of the present invention. Specifically, the configurations of the device that are shown in the diagrams are merely an example for showing the minimum functional configurations required for realizing the present invention. Therefore, the specific system configuration, hardware configuration and software configuration included in the peripheral equipment can be selected appropriately. Similarly, the flowcharts shown in the diagrams are merely an example of the flow of process performed by the device of the present invention. Therefore, a specific process flow can be changed accordingly depending on the configuration of the device or the data configuration to be used.

For example, in the embodiments described above, when the two-dimensional data generation processes are started, the input of the starting instruction is supported for the user by means of the GUI screen and the series of two-dimensional data generation processes are performed in response to the input starting instruction. However, the two-dimensional data generation processes may be started automatically as a batch process, under the condition that new three-dimensional data is acquired without using the user.

Examples of such batch process include a method for automatically starting the two-dimensional generation processes at a point in time when the three-dimensional data is acquired, or a method for regularly checking whether the three-dimensional data is acquire or not and, when new three-dimensional data is detected, starting the two-dimensional generation processes automatically.

Conversely, the user may be allowed to interactively confirm the result of the subsequent diagram generation process, line segment integration process, coplanarization process, and attribute information application process in the series of two-dimensional data generation processes, once these processes are completed.

In the embodiments described above, although the three-dimensional arrangement adjustment CAD unit is provided to the drawing generation device, the present invention can implement a configuration in which the three-dimensional data generated by an external device is input and used without providing the three-dimensional arrangement adjustment CAD unit to the drawing generation device.

Moreover, in the embodiments described above, although the line segment integration process, coplanarization process and attribute information application process are performed in this order, these processes may be carried out in a different order. Furthermore, the line segment integration process and the attribute information application process can be omitted, but it is generally desired that these processes be performed in view of the simplification and usability of the drawing.

In the embodiments described above, although the attribute information application process is performed automatically, the attribute information that are input manually by the user may be attached, or both the automatic attribute information application process and the manual attribute information application process may be performed. By executing the automatic process and the manual process as described above, the attribute information application process can be performed flexibly, and consequently a two-dimensional data drawing with more useful information and high practicality can be generated.

This application claims priority from Japanese Patent Application 2008-155979, filed Jun. 13, 2008, which is incorporated herein by reference in its entirety.

The invention claimed is:

1. A drawing generation device for electric cable housing components, which converts three-dimensional data of electric cable housing components generated by a three-dimensional arrangement adjustment CAD into two-dimensional data by using a computer, and outputs the converted data in the form of drawing, the computer comprising:
   interface means for performing input/output of various instructions and data;
   two-dimensional data generation means for processing the three-dimensional data of electric cable housing components to generate a drawing of the two-dimensional data; and
   storage means for storing three-dimensional data of electric cable housing components that is acquired by the interface means or another means, as well as two-dimensional data of electric cable housing components that is obtained as a result of a process performed by the two-dimensional data generation means,
   wherein the two-dimensional data generation means comprises:
   data reading means for reading the three-dimensional data of electric cable housing components that is stored in the storage means;
   diagram generation means for converting the three-dimensional data of electric cable housing components, which is read by the data reading means, into a line segment for each component, and converting a contact part between the components or a part where the components partially overlap with each other, into an intersection point, to convert the three-dimensional data of electric cable housing components and generate a diagram composed of the line segment and intersection point;
   coplanarization means for projecting the line segments of a plurality of components that overlap with each other in a vertical direction on the diagram generated by the diagram generation means, onto a single plane which is orthogonal to the vertical direction, and shifting the line segments along the single plane so that each of the line segments is disposed in a different position from other line segments thereby representing the vertical overlap on the single plane;
   file output means for outputting, from the interface means, the two-dimensional data of electric cable housing components that is obtained by the diagram generation means and the coplanarization means, in the form of file, and storing the output two-dimensional data in the form of a file in the storage means.

2. The drawing generation device for electric cable housing components according to claim 1, further comprising:
   three-dimensional arrangement adjustment CAD means for generating three-dimensional data of the electric cable housing components in response to data input from a user,
   wherein the two-dimensional data generation means processes the three-dimensional data of electric cable housing components generated by the three-dimensional arrangement adjustment CAD means.

3. The drawing generation device for electric cable housing components according to claim 1, wherein the diagram generation means, for the three-dimensional data of electric cable housing components, which is read by the data reading means, converts trajectories of respective specific parts of the electric cable housing components into line segment information.

4. The drawing generation device for electric cable housing components according to claim 3, wherein the diagram generation means, for the three-dimensional data of electric cable housing components, which is read by the data reading means, calculates a central line from the shape of each electric cable housing component, and performs drawing of the component the calculated central line as line segment information.

5. The drawing generation device for electric cable housing components according to claim 1, wherein, when the contact part between the components or the partially overlapped part between the components is converted into an intersection point by the diagram generation means,
   the diagram generation means is capable of determining whether the components are brought into contact with each other based on a preset setting range, and when the size of the part is within the setting range, recognizing the components as continuous electric cable housing components, calculating the intersection point between the components, and inserting a symbol serving as the intersection point; and
   the diagram generation means, when a line segment of a branch does not reach an intersection point with a line segment of a mainstream component, extends the line segment of the branch up to that of the mainstream component to interpolate the branch part.

6. The drawing generation device for electric cable housing components according to claim 1, wherein the two-dimensional data generation means comprises line segment unification means for unifying line segments of a plurality of electric cable housing components in a diagram which is generated by the diagram generation means, when the three-dimensional data of the plurality of the electric cable housing components, which is read by the data reading means, are continuously arranged in series.

7. The drawing generation device for electric cable housing components according to claim 6, wherein, when the three-dimensional data of the plurality of the electric cable housing components, which is read by the data reading means, are continuously arranged in series, and trajectories of respective specific parts of the plurality of components have the same vector, the line segment unification means unifies line segments of the plurality of the components in a diagram which is generated the diagram generation means, into one line segment, and deletes an unnecessary intersection point between the plurality of components.

8. The drawing generation device for electric cable housing components according to claim 1, wherein, when the three-dimensional data of the plurality of the electric cable housing components, which is read by the data reading means, are overlapped in the vertical direction, the coplanarization means, onto a single plane having the same height as the height of one of the line segments of the plurality of components, projects the other line segments, and shifts the line segments on the plane and arranges in the rank order of original height of the components to perform drawing.

9. The drawing generation device for electric cable housing components according to claim 8, wherein, when the line segments of the plurality of the electric cable housing components are projected to the same height from the three-dimensional data of the plurality of the components, the coplanarization means uses unique colors which are preset according to the rank order of original height of the components to perform drawing of the line segments.

10. The drawing generation device for electric cable housing components according to claim 1, wherein the two-dimensional data generation means comprises attribute information attaching means for attaching a description of attribute information indicator which represents attribute information of the three-dimensional data of the electric cable housing components, which is read by the data reading means, to the vicinity of the line segments of the component.

11. The drawing generation device for electric cable housing components according to claim 10, wherein:
when the three-dimensional data of the plurality of the electric cable housing components, which is read by the data reading means, are overlapped in the vertical direction, the coplanarization means, onto a single plane having the same height as the height of one of the line segments of the plurality of components, projects the other line segments, and shifts the line segments on the plane and arranges in the rank order of original height of the components to perform drawing;
the attribute information attaching means describes attribute information indicators which represent each attribute information of the three-dimensional data of the plurality of the electric cable housing components, in an order that is settled according to the rank order of original height of the plurality of the components.

12. The drawing generation device for electric cable housing components according to claim 11, wherein:
when the line segments of the plurality of the electric cable housing components are projected to the same height from the three-dimensional data of the plurality of the components, the coplanarization means uses unique colors which are preset according to the rank order of original height of the components to perform drawing of the line segments;
the attribute information attaching means describes respective attribute information indicators which represent each attribute information of the three-dimensional data of the plurality of the electric cable housing components, by the same unique color as that for the component.

13. The drawing generation device for electric cable housing components according to claim 10, wherein the attribute information attaching means describes an attribute information indicator which represents a plurality type of attribute information including at least one type of route number, route type, vertical direction height of component, as the attribute information of the three-dimensional data of the electric cable housing components which is read by the data reading means, to the vicinity of a line segment of the component.

14. The drawing generation device for electric cable housing components according to claim 10, wherein the attribute information attaching means describes base line information indicator which represents base line information of a building structure where an electric cable housing component is placed, to a diagram which is generated by the diagram generation means, such that the indicator is positionally associated with the line segment of the component in the diagram.

15. The drawing generation device for electric cable housing components according to claim 10, wherein the attribute information attaching means connects an attribute information indicator which is described to the vicinity of a line segment of the electric cable housing component, with the line segment via a leading line.

16. A drawing generation method for electric cable housing components, which converts three-dimensional data of electric cable housing components generated by a three-dimensional arrangement adjustment CAD into two-dimensional data by using a computer, and outputs the converted data in the form of drawing, the computer comprising:
interface means for performing input/output of various instructions and data;
two-dimensional data generation means for processing the three-dimensional data of electric cable housing components to generate a drawing of the two-dimensional data; and
storage means for storing three-dimensional data of electric cable housing components that is acquired by the interface means or another means, as well as two-dimensional data of electric cable housing components that is obtained as a result of process performed by the two-dimensional data generation means,
wherein the two-dimensional data generation means performs the steps of:
reading the three-dimensional data of electric cable housing components that is stored in the storage means;
converting the three-dimensional data of electric cable housing components, which is read by the data reading step, into a line segment for each component, and converting a contact part between the components or a part where the components partially overlap with each other, into an intersection point, to convert the three-dimensional data of electric cable housing components and generate a diagram composed of the line segment and intersection point;

projecting the line segments of a plurality of components that overlap with each other in a vertical direction on the diagram generated by the diagram generation step, onto a single plane, which is orthogonal to the vertical direction, and shifting the line segments along the single plane so that each of the line segments is disposed in a different position from other line segments thereby representing the vertical overlap on the single plane;

outputting, from the interface means, the two-dimensional data of electric cable housing components that is obtained by the diagram generation step and the coplanarization step, in the form of file, and storing the output two-dimensional data in the form of file in the storage means.

\* \* \* \* \*